(12) United States Patent
Wu et al.

(10) Patent No.: US 12,538,793 B2
(45) Date of Patent: Jan. 27, 2026

(54) METAL INSULATOR METAL CAPACITOR STRUCTURE AND METHOD OF MANUFACTURING THE SAME

(71) Applicant: Taiwan Semiconductor Manufacturing Company, Ltd., Hsinchu (TW)

(72) Inventors: Ching-Jing Wu, Zaoqiao Township (TW); Yun-Chin Tsou, Hsinchu (TW); An Shun Teng, Hsinchu (TW); Mingni Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 242 days.

(21) Appl. No.: 17/807,183

(22) Filed: Jun. 16, 2022

(65) Prior Publication Data
US 2023/0411276 A1 Dec. 21, 2023

(51) Int. Cl.
*H01L 23/522* (2006.01)
*H10D 1/68* (2025.01)

(52) U.S. Cl.
CPC ......... *H01L 23/5222* (2013.01); *H10D 1/696* (2025.01)

(58) Field of Classification Search
CPC . H01L 23/5222; H01L 28/75; H01L 23/5223; H01L 28/60; H10D 1/714; H10D 1/692; H10D 1/696
See application file for complete search history.

(56) References Cited

U.S. PATENT DOCUMENTS

| | | | |
|---|---|---|---|
| 2005/0164488 A1* | 7/2005 | Park | H10D 1/682 438/622 |
| 2019/0305078 A1* | 10/2019 | Wu | H10D 1/042 |
| 2021/0118981 A1* | 4/2021 | Tsai | H01L 23/528 |
| 2022/0350445 A1* | 11/2022 | Bang | H10K 59/40 |

* cited by examiner

*Primary Examiner* — Thanhha S Pham
(74) *Attorney, Agent, or Firm* — Sterne, Kessler, Goldstein & Fox P.L.L.C.

(57) ABSTRACT

The present disclosure relates to a semiconductor structure and a manufacturing method, and more particularly to a 3D metal insulator metal (MIM) capacitor structure. The MIM capacitor structure includes a first capacitor electrode formed on a top surface of a substrate, a dielectric layer formed on top and side surfaces of the first capacitor electrode and on the top surface of the substrate, and a second capacitor electrode formed on top and side surfaces of the dielectric layer. The first capacitor electrode has a first width. The second capacitor electrode has a second width greater than the first width.

20 Claims, 17 Drawing Sheets

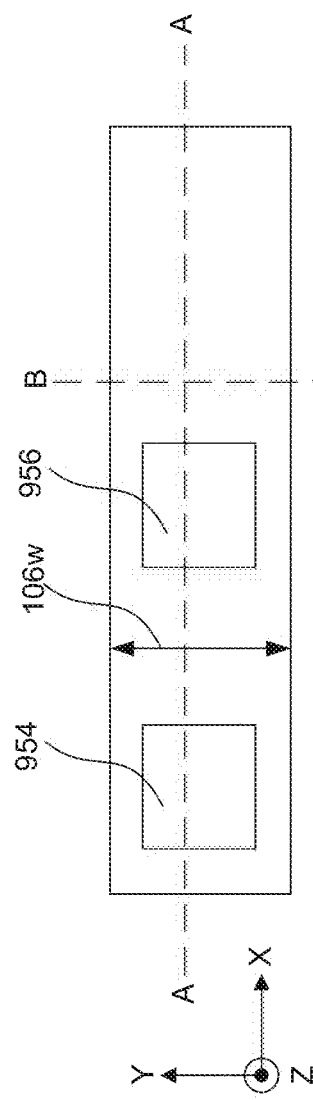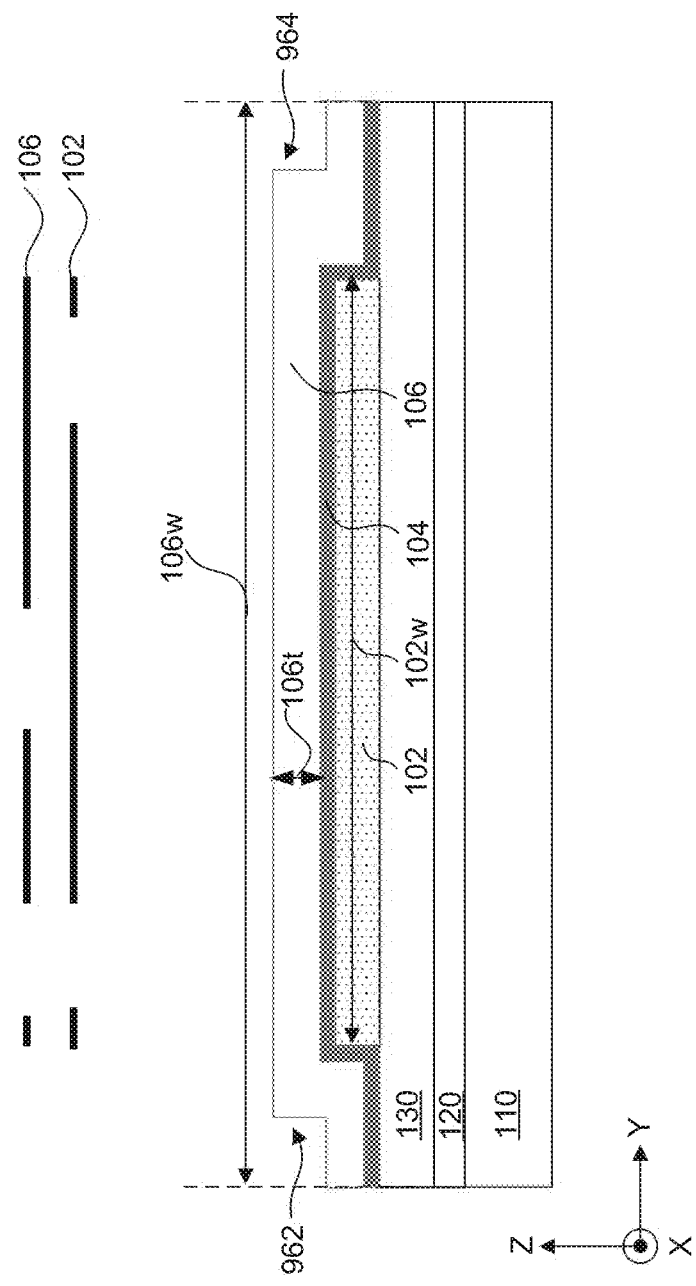
FIG. 9A
FIG. 9B
FIG. 9C

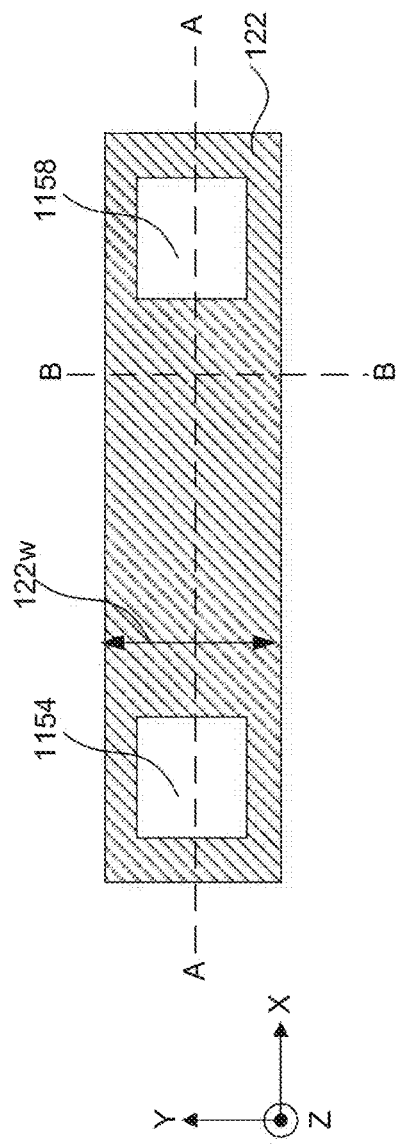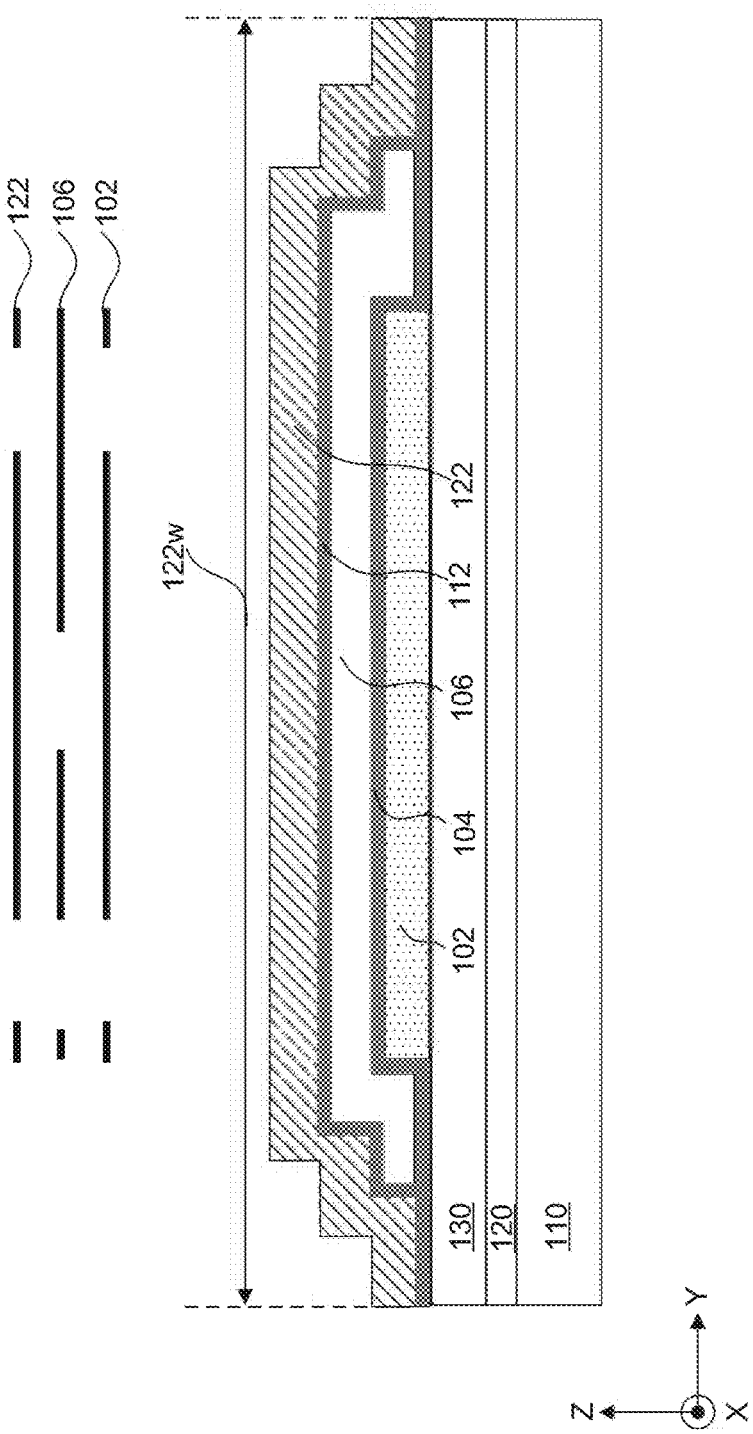
FIG. 11A
FIG. 11B
FIG. 11C

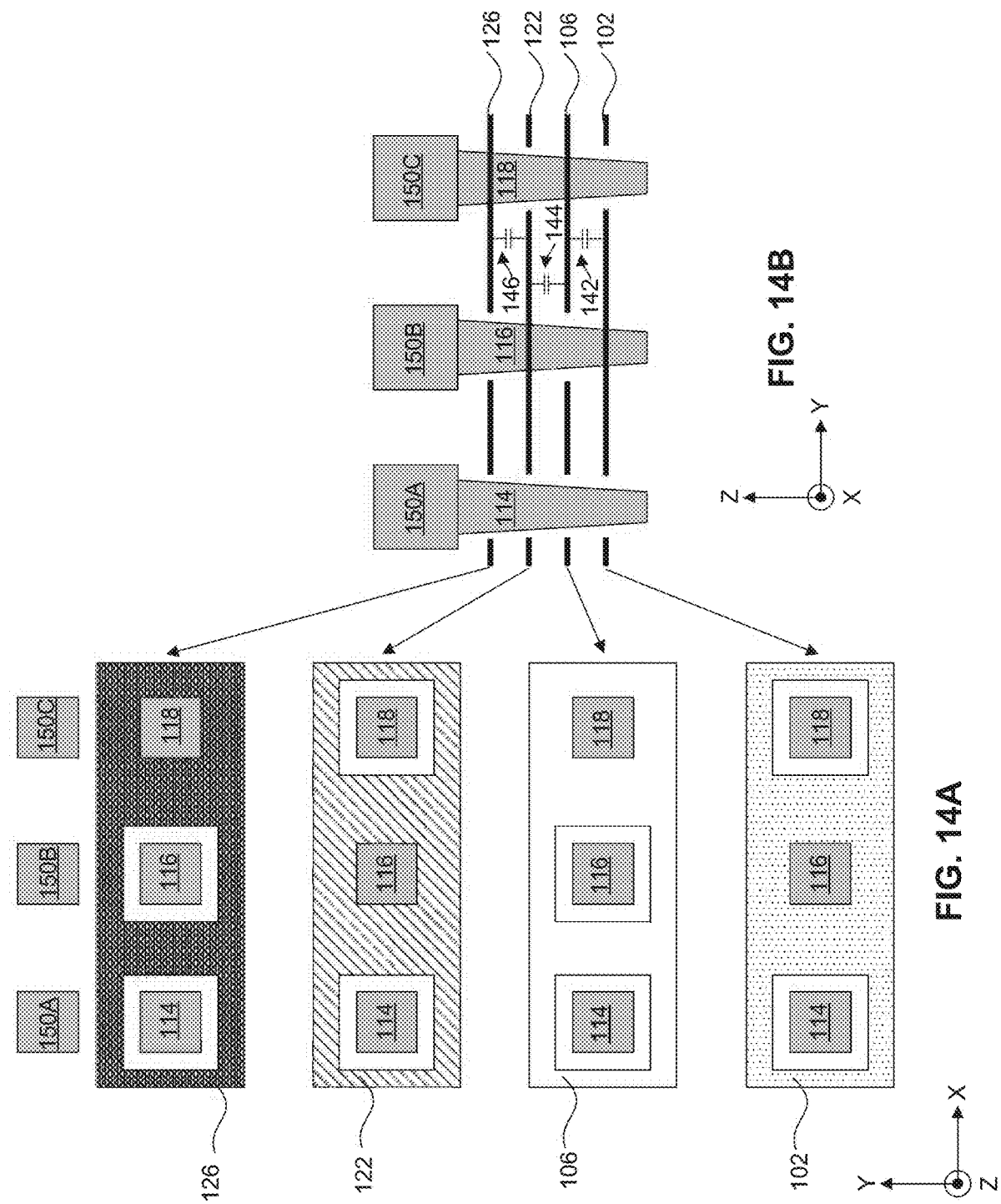

METAL INSULATOR METAL CAPACITOR STRUCTURE AND METHOD OF MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of the IC evolution, functional density (e.g., the number of interconnected devices per chip area) has generally increased while geometry size (e.g., the smallest component or line that can be created using a fabrication process) has decreased. The continuous development of three dimensional (3D) IC package requires integration of decoupling capacitors, such as metal-insulator-metal (MIM) capacitors, into the 3D IC package to improve voltage stabilization with internal interconnects.

BRIEF DESCRIPTION OF THE DRAWINGS

Aspects of the present disclosure are best understood from the following detailed description when read with the accompanying figures.

FIGS. 7A-14B illustrate top-down, schematic, and cross-sectional views of an MIM capacitor structure at various stages of its fabrication, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
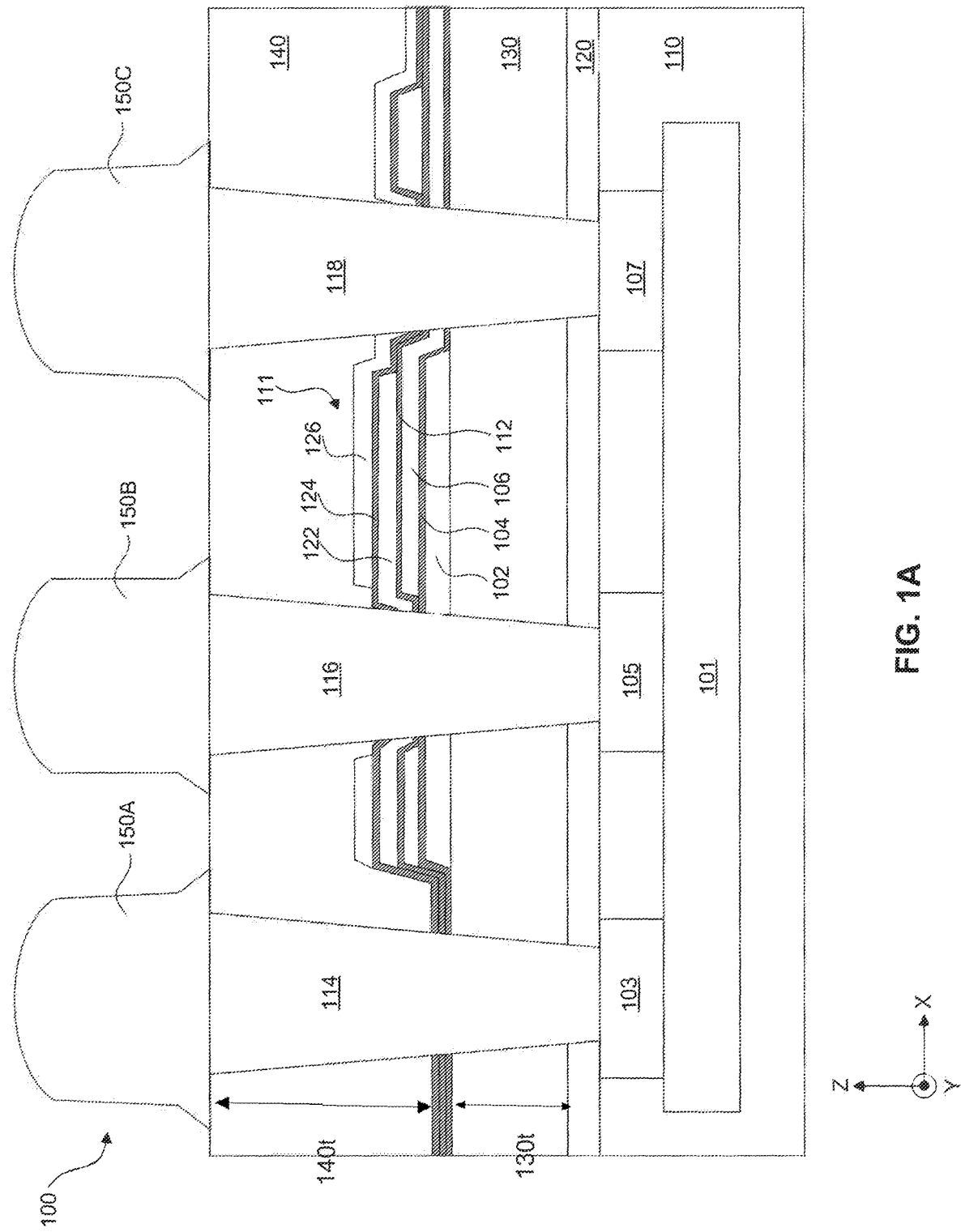
FIGS. 1A-1D illustrate cross-sectional, top-down, and schematic views of a semiconductor structure with a metal-insulator-metal (MIM) capacitor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

Capacitors are elements that are used in semiconductor devices for storing an electrical charge. Capacitors are used in, for example, filters, analog-to-digital converters, memory devices, control applications, decoupling capacitors, and many other types of semiconductor devices. In a chip fabrication process, decoupling capacitors can be built into chips to prevent voltage spikes and filter noise signals in a power supply or an electric signal. The voltage fluctuations and noises can affect signal integrity, reliability, and speed of the semiconductor devices. Integrating the decoupling capacitor into three dimensional (3D) IC package of semiconductor devices has the benefit of voltage stabilization and internal interconnects, thus decreasing time delay.

One type of capacitor is a metal-insulator-metal (MIM) capacitor. The MIM capacitor can be formed with two conductive capacitor plates in parallel with a dielectric layer sandwiched therebetween. As technologies progress, integrated circuits are characterized by decreasing dimension requirements over previous generation devices. Dimensions of capacitors are also decreased, which can lead to reduced capacitances. However, in some applications, a higher capacitance is needed to maintain and improve device electrical performance.

Capacitance can be affected by a number of factors, such as the dielectric constant of the dielectric material of the dielectric layer, the dimensions of the capacitor plates, and the distance separating the capacitor plates. Specifically, capacitance is proportional to the dielectric constant and effective surface area of the capacitor plates, while it is inversely proportional to the separation between the capacitor plates according to the following parallel plate capacitance formula:

$$C = k\varepsilon_o \frac{A}{d}$$

where C is the capacitance of the MIM capacitor, k is the dielectric constant of the dielectric layer in the MIM capacitor, $\varepsilon_0$ is the dielectric constant of free space, A is area of the capacitor plates in the MIM capacitor, and d is the distance between the capacitor plates of the MIM capacitor (e.g., the thickness of the dielectric layer). For example, a greater dielectric constant or capacitor plate dimension can increase capacitance, while a larger separation between the capacitor plates can reduce capacitance.

Further, adjusting these factors to increase the capacitance may entail a number of problems. For example, replacing the dielectric layer with a higher dielectric constant (i.e., high-k) dielectric material may be prone to worse high-k dielectric material damage. High-k dielectric material may be damaged during subsequent capacitor plate etching processes, especially around the capacitor plate corners. High-k dielectric material damage can cause high-leakage current between the capacitor plates and delamination defects that degrade reliability of the MIM capacitor.

Various embodiments in accordance with this disclosure provide methods of forming a MIM capacitor structure in a semiconductor structure to increase capacitance per unit area and decrease high-k dielectric material damage. A first electrode layer can be formed on a substrate. A high-k dielectric material with a higher dielectric constant can be conformally deposited on the first electrode layer to reduce the capacitance of the MIM capacitor structure. A second electrode layer can be formed on the high-k dielectric material to cover the first electrode layer and the substrate. The second electrode layer can have a greater width than the first electrode layer to protect the high-k material from subsequent etching damage. In accordance with some embodiments of this disclosure, the MIM capacitor structure includes the following benefits: (i) a higher capacitance per unit area; (ii) a reduction in damage to high-k dielectric material; (iii) a reduction in leakage current of the MIM capacitor structure by, for example, about two orders of magnitude; and (iv) reliability improvement of the MIM capacitor.

Figure 1B:
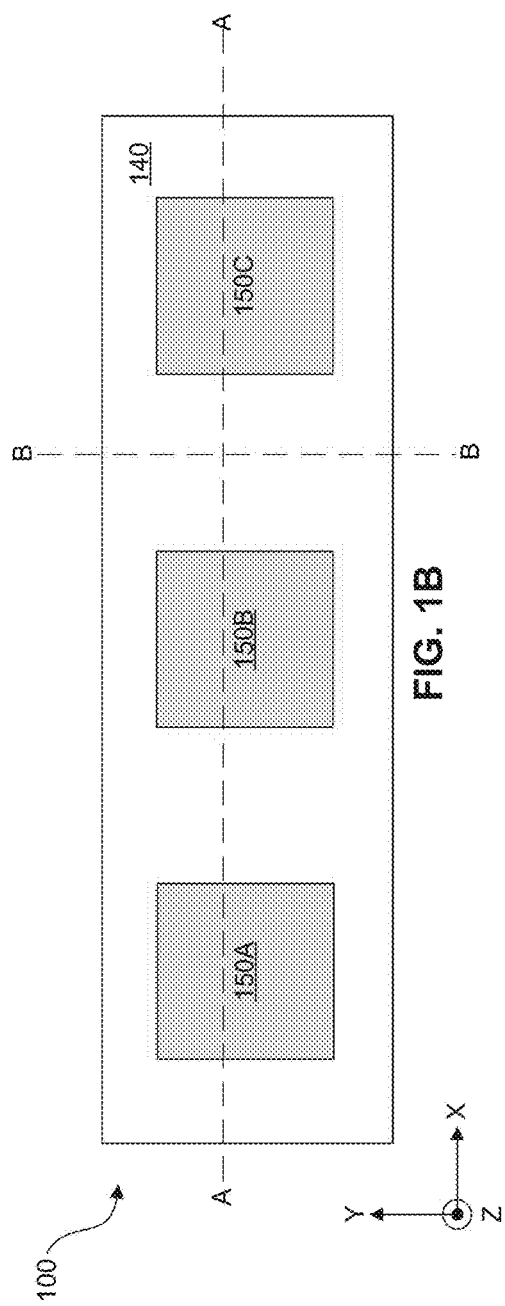
Figure 1C:
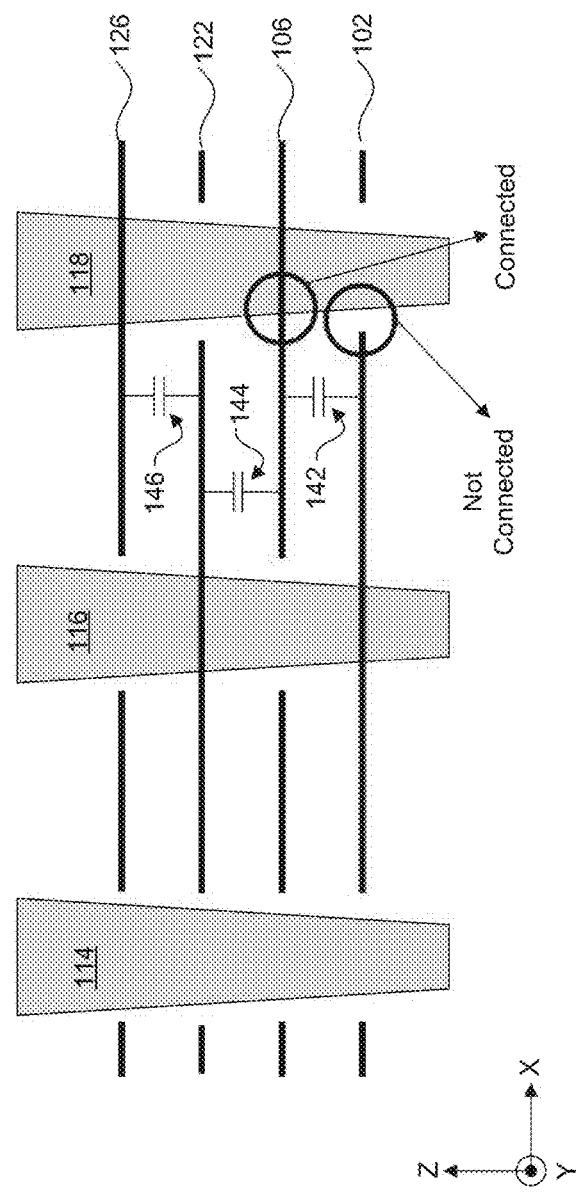
Figure 1D:
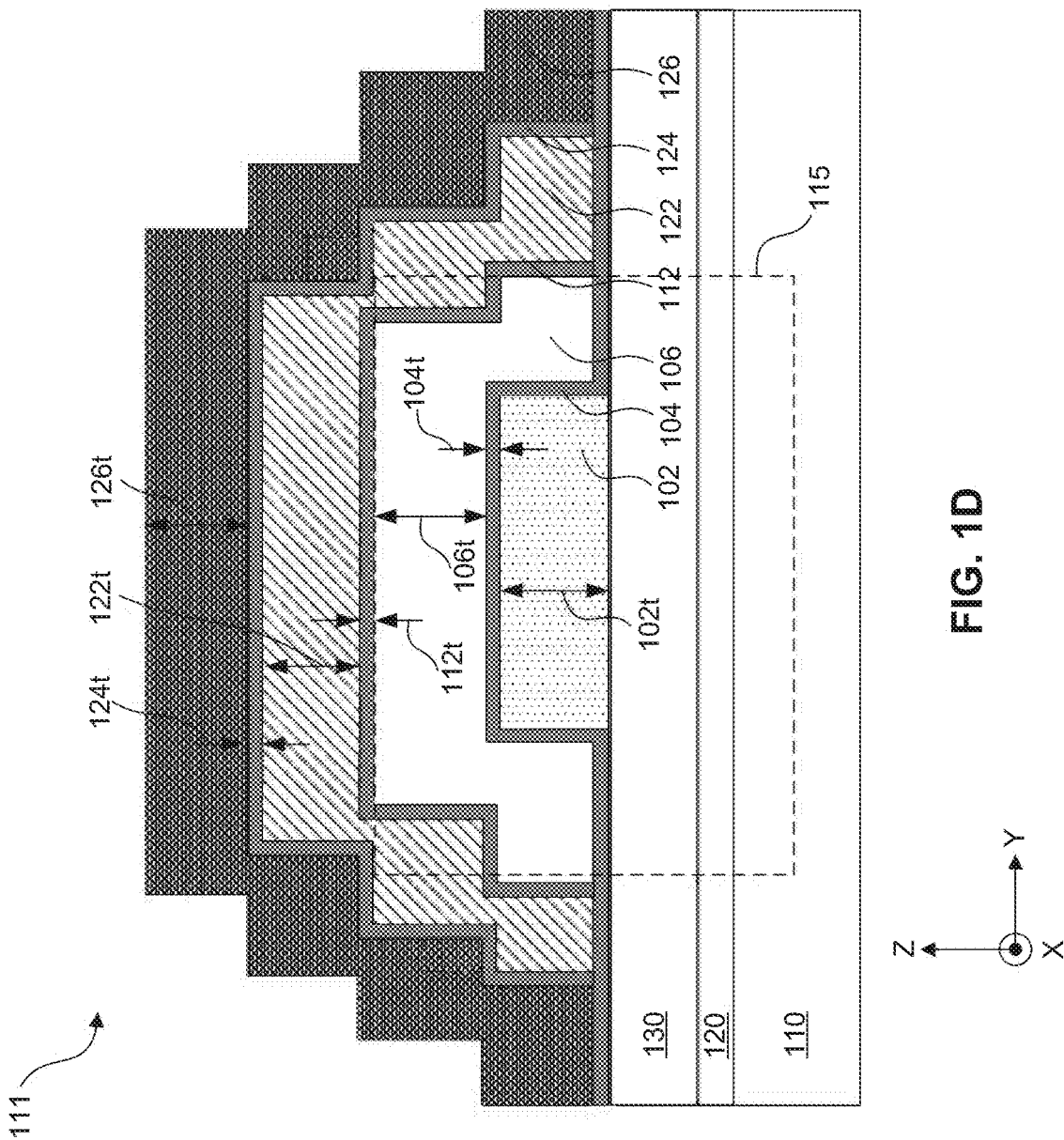

FIGS. 1A-1D illustrate cross-sectional, schematic, and top-down views of semiconductor structure 100 with a metal-insulator-metal (MIM) capacitor structure 111, in accordance with some embodiments. According to some embodiments, FIG. 1A illustrates the cross-sectional view of semiconductor structure 100 along line A-A in FIG. 1B, FIG. 1B illustrates the top-down view of semiconductor structure 100, FIG. 1C illustrates the schematic view of capacitor plate connections of MIM capacitor structure 111, and FIG. 1D illustrates the cross-sectional view of MIM capacitor structure 111 along line B-B in FIG. 1B. As shown in FIGS. 1A-1D, semiconductor structure 100 can include a substrate 110 having a semiconductor device 101 and interconnects 103, 105, and 107, an etch stop layer (ESL) 120, a first passivation layer 130, MIM capacitor structure 111, redistribution vias 116 and 118, a second passivation layer 140, and redistribution structures 150A-150C. MIM capacitor structure 111 be disposed on first passivation layer 130 and can include a first capacitor electrode 102, a first dielectric layer 104, a second capacitor electrode 106, a second dielectric layer 112, a third capacitor electrode 122, a third dielectric layer 124, and a fourth capacitor electrode 126. Capacitance of MIM capacitor structure 111 can be determined by a number of parameters, such as a dielectric constant of dielectric layers 104, 112, and 124, overlap plate dimensions between first, second, third, and fourth capacitor electrodes 102, 106, 122, and 126, and capacitor plate separations between them (e.g., thicknesses of dielectric layers 104, 112, and 124).

Referring to FIGS. 1A-1D, MIM capacitor structure 111 can be formed on substrate 110. Interconnects 103, 105, and 107 and redistribution vias 114, 116, and 118 can connect semiconductor device 101 to substrate 110 to redistribution structures 150A-150C. Redistribution via 116 can connect to interconnect 105 and first and third capacitor electrodes 102 and 122 of MIM capacitor structure 111. Redistribution via 118 can connect to interconnect 107 and second and fourth capacitor electrodes 106 and 126 of MIM capacitor structure 111. Redistribution via 114 can connect to interconnect 103 without connecting to first, second, third, and fourth capacitor electrodes 102, 106, 122, and 126. MIM capacitor structure 111 can prevent voltage spikes and filter noise signals of a power supply or an electric signal to semiconductor device 101 through redistribution vias 116 and 118.

In some embodiments, substrate 110 can include a silicon (Si) substrate. In some embodiments, substrate 110 can include (i) another elementary semiconductor, such as germanium (Ge); (ii) a compound semiconductor, such as silicon carbide (SiC); (iii) an alloy semiconductor, such as silicon germanium (SiGe); or (iv) combinations thereof. In some embodiments, substrate 110 can include a semiconductor on insulator (SOI). In some embodiments, substrate 110 can include an epitaxial material. Semiconductor device 101 can be formed on substrate 110. In some embodiments, semiconductor device 101 can include a logic device, a memory device, and other suitable semiconductor devices. Interconnects 103, 105, and 107 can connect semiconductor device 101 to redistribution structures 150A-150C and other parts of semiconductor structure 100 or the IC package including semiconductor structure 100. In some embodiments, interconnects 103, 105, and 107 can include any suitable conductive material, such as tungsten (W), aluminum (Al), copper (Cu), cobalt (Co), titanium (Ti), tantalum (Ta), ruthenium (Ru), a silicide material, and a conductive nitride material.

ESL 120 can be disposed on substrate 110 to protect interconnects 103, 105, and 107 during the formation of redistribution vias 114, 116, and 118, according to some embodiments. ESL 120 can act as the etch stop point during an etching of first passivation layer 130. In some embodiments, ESL 120 can include a dielectric material composed of silicon, carbon, and/or nitrogen. In some embodiments, a carbon concentration in ESL 120 can range from about 20% to about 40% to improve an etch selectivity between ESL 120 and first passivation layer 130. In some embodiments, the etch selectivity between ESL 120 and first passivation layer 130 can range from about 5 to about 50. In some embodiments, ESL 120 can include a layer of silicon carbon nitride (SiCN), a layer of silicon oxycarbonitride. (SiOCN), a layer of silicon oxide carbide (SiOC), or a combination thereof. In some embodiments, ESL 120 can have a thickness $120t$ ranging from about 50 nm to about 250 nm. If thicknesses $120t$ is less than about 50 nm, the etching process may not effectively stop on ESL 120. If thickness 120t is greater than about 250 nm, the etch stop effect of ESL 120 may not improve and the manufacturing cost may increase—which are both undesirable.

First passivation layer 130 can be disposed on ESL 120 to protect semiconductor devices and structure on substrate 110 from water vapor and other contamination defects, according to some embodiments. First passivation layer 130 can include a dielectric material composed of silicon and nitrogen. In some embodiments, first passivation layer 130 can include a layer of silicon nitride (SiN), a layer of silicon boron nitride (SiBN), or a combination thereof. In some embodiments, first passivation layer 130 can have a thickness 130t ranging from about 300 nm to about 900 nm. If thicknesses 130t is less than about 300 nm, first passivation layer 130 may not protect substrate 110 from water vapor and other contamination defects. If thickness 130t is greater than about 900 nm, the passivation effect of first passivation layer 130 may not improve and the manufacturing cost may increase—which are both undesirable.

MIM capacitor structure 111 can be disposed on first passivation layer 130 to prevent voltage spikes and filter noise signals of a power supply or an electric signal through redistribution vias 114, 116, and 118. Redistribution vias 114, 116, and 118 can connect redistribution structures 150A-150C to interconnects 103, 105, and 107. The power supply or the electric signal can be provided to semiconductor device 101 on substrate 110 through redistribution structures 150A-150C, redistribution vias 114, 116, and 118, and interconnects 103, 105, and 107. As illustrated in FIG. 1C, redistribution via 116 can connect to first and third capacitor electrodes 102 and 122. Redistribution via 118 can connect to second and fourth capacitor electrodes 106 and 126. First, second, third, and fourth capacitor electrodes 102, 106, 122, and 126 can form capacitors 142, 144, and 146 of MIM capacitor structure 111. Capacitors 142, 144, and 146 can be connected in parallel between redistribution vias 116 and 118, increasing the capacitance of MIM capacitor structure 111.

As shown in FIG. 1D, MIM capacitor structure 111 can include first capacitor electrode 102, first dielectric layer 104, second capacitor electrode 106, second dielectric layer 112, third capacitor electrode 122, third dielectric layer 124, and fourth capacitor electrode 126 stacked on top of each other. First capacitor electrode 102 can be disposed on first passivation layer 130. In some embodiments, each of capacitors 142, 144, and 146 can have a top electrode and a bottom electrode. In some embodiments, a top electrode in a capacitor can act as a bottom electrode in another capacitor above. For example, as shown in FIGS. 1C and 1D, first capacitor electrode 102 can act as a bottom electrode of capacitor 142 and second capacitor electrode 106 can act as a top electrode of capacitor 142. At the same time, second capacitor electrode 106 can also act as a bottom electrode of capacitor 144.

In some embodiments, first, second, third, and fourth capacitor electrodes 102, 106, 122, and 126 can include a conductive material, such as an aluminum copper alloy (AlCu), tantalum nitride (TiN), Al, Cu, W, metal silicide, other suitable metals or metal alloys, and combinations thereof. In some embodiments, first, second, third, and fourth capacitor electrodes 102, 106, 122, and 126 can include the same conductive material or different conductive materials. In some embodiments, each of first, second, third, and fourth capacitor electrodes 102, 106, 122, and 126 can include more than one layer. In some embodiments, first, second, third, and fourth capacitor electrodes 102, 106, 122, and 126 can have thicknesses 102t, 106t, 122t, and 126t ranging from about 20 nm to about 80 nm. If thickness 102t, 106t, 122t, or 126t is less than about 20 nm, capacitor electrodes 102, 106, 122, and 126 may not be substantially uniform and the resistance of the capacitor electrodes may increase. If thickness 102t, 106t, 122t, and 126t are greater than about 80 nm, the uniformity of capacitor electrodes 102, 106, 122, and 126 may not improve and the manufacturing cost may increase—which are both undesirable. In some embodiments, first, second, third, and fourth capacitor electrodes 102, 106, 122, and 126 can have the same thickness or different thicknesses.

First, second, and third dielectric layers 104, 112, and 124 can be disposed between first, second, third, and fourth capacitor electrodes 102, 106, 122, and 126, as shown in FIG. 1D. First, second, and third dielectric layers 104, 112, and 124 can include a high-k dielectric material. The high-k dielectric material can have a dielectric constant between about 3.9 and about 1000 to increase the capacitance of MIM capacitor structure 111. If the dielectric constant is less than about 3.9, the dielectric material may not reduce capacitance of MIM capacitor structure 111. In some embodiments, first, second, and third dielectric layers 104, 112, and 124 can include any suitable dielectric material, such as silicon nitride (SiN$_x$), hafnium oxide (HfO$_2$), other suitable dielectric materials, and combinations thereof. In some embodiments, each of first, second, and third dielectric layers 104, 112, and 124 can include the same high-k dielectric material or different high-k dielectric materials. In some embodiments, each of first, second, and third dielectric layers 104, 112, and 124 can include one or more layers. In some embodiments, first, second, and third dielectric layers 104, 112, and 124 can have thicknesses 104t, 112t, and 124t ranging from about 1 nm to about 10 nm. In some embodiments, a ratio of thickness 102t to thickness 104t, thickness 106t to thickness 112t, or thickness 122t to thickness 124t can range from about 2 to about 50. If thickness 104t, 112t, or 124t is less than about 1 nm, or the ratio is greater than about 50, the leakage current between capacitor electrodes may increase. If thicknesses 104t, 112t, and 124t are greater than about 10 nm, or the ratio is less than about 2, the capacitance of MIM capacitor structure 111 may decrease.

In some embodiments, a top electrode in capacitor electrodes 102, 106, 122, and 126 can have a larger size than a bottom electrode to cover dielectric layers 104, 112, and 124 and prevent high-k dielectric material damage. For a smaller top electrode than a bottom electrode, the damage to the dielectric layer between the top and bottom electrodes can aggregate with the increase of the number of capacitor electrodes. Each time, during the formation of an additional top electrode, the dielectric layer can be exposed and damaged by the etching process of the additional top electrode. A larger top electrode can protect the dielectric layer from etching damage. For example, as shown in FIGS. 2A and 2B, top second capacitor electrode 106 can have a larger width than bottom first capacitor electrode 102.

Figure 2A:
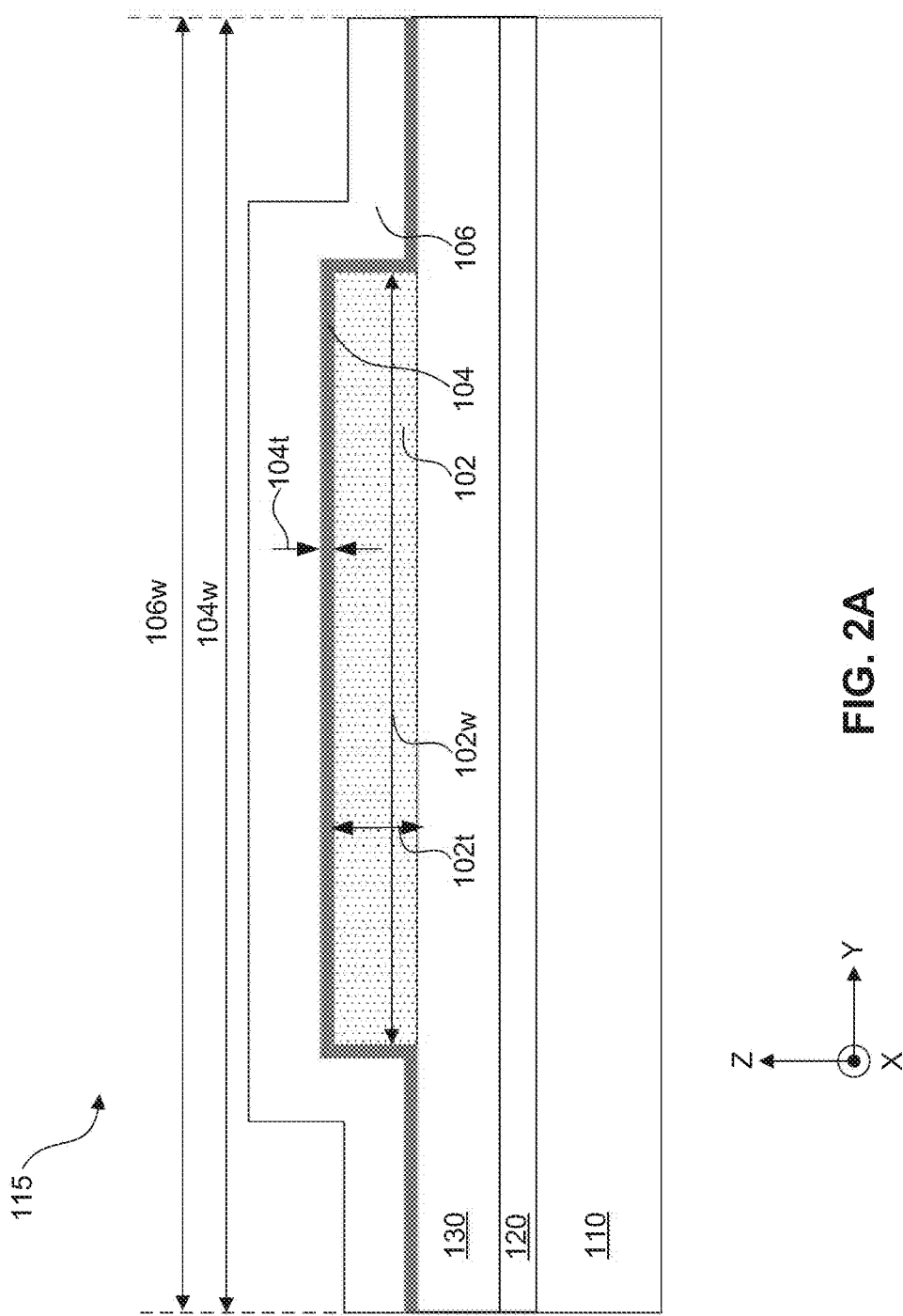
FIGS. 2A and 2B illustrate cross-sectional and top-down views of a zoomed-in region of a MIM capacitor structure, in accordance with some embodiments.
Figure 2B:
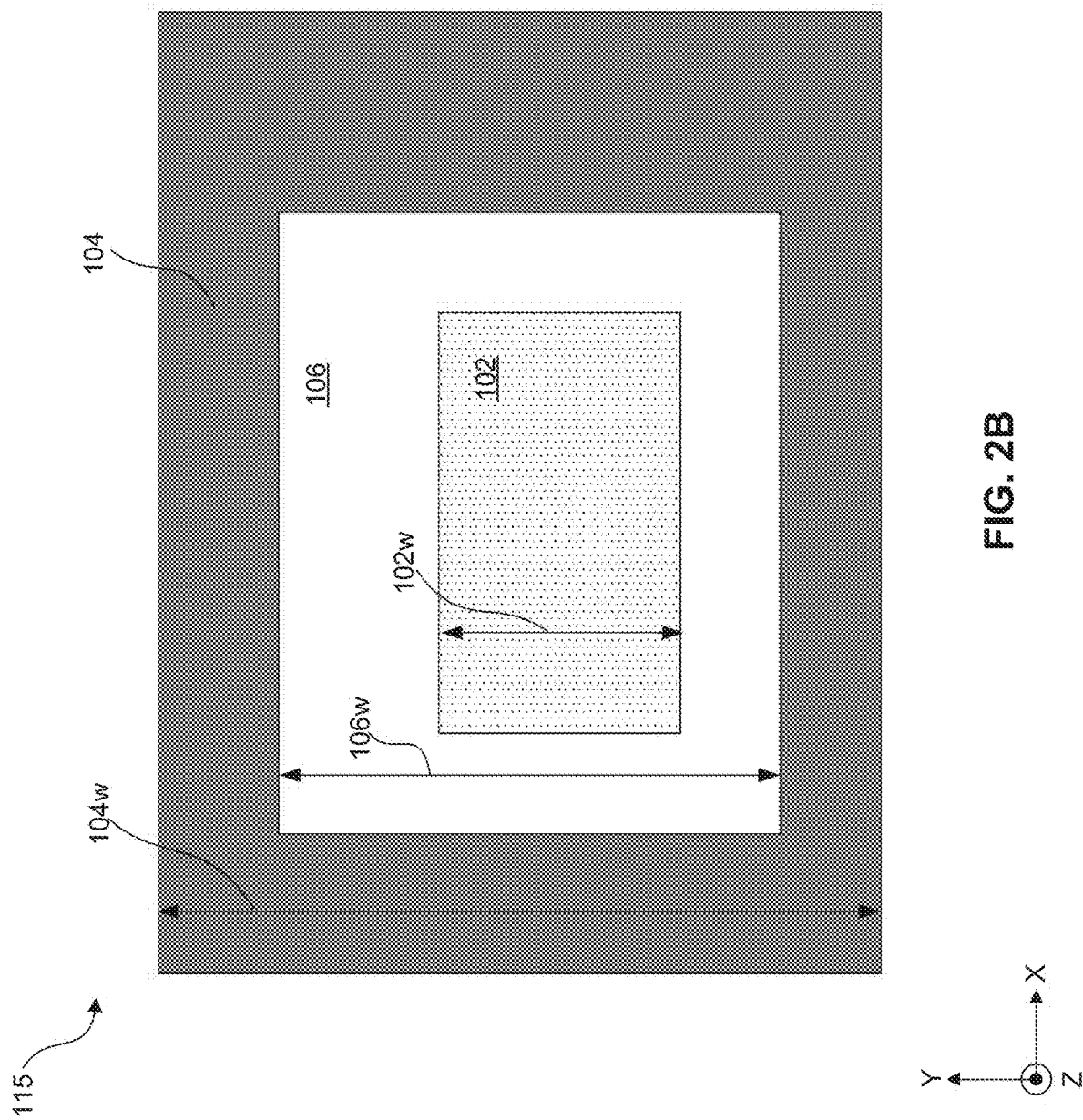

FIGS. 2A and 2B illustrate cross-sectional and top-down views of zoomed-in region 115 in MIM capacitor structure 111, in accordance with some embodiments. In some embodiments, first capacitor electrode 102 can have a width 102w ranging from about 1 um to about 50 um. First dielectric layer 104 can have a width 104w ranging from about 25 um to about 250 um. Second capacitor electrode 106 can have a width 106w ranging from about 25 um to about 250 um. In some embodiments, width 104w can be greater than width 102w to ensure full coverage of high-k dielectric material on first capacitor electrode 102. In some embodiments, width 104w can be greater than a sum of width 102w and thickness 104t to ensure full coverage of high-k dielectric material on first capacitor electrode 102. A difference between 104w and 102w can range from about 0.2 um to about 225 um. In some embodiments, width 106w can be greater than width 102w to ensure full coverage of first capacitor electrode 102 by second capacitor electrode 106. A difference between width 106w and width 102w can range from about 0.2 um to about 225 um. In some embodiments, a ratio of width 106w to width 102w can range from about 1 to about 10. If the ratio is less than about 1, second capacitor electrode 106 may not cover first capacitor electrode 102 and first dielectric layer 104, and first dielectric layer 104 may be damaged during subsequent etching process. If the ratio is greater than about 25, the capacitance of MIM capacitor structure 111 may not increase and the manufacturing cost may increase—which are both undesirable.

With a high-k dielectric material for dielectric layers 104, 112, and 124 and a larger top electrode than a bottom electrode for capacitor electrodes 102, 106, 122, and 126, MIM capacitor structure 111 can achieve a higher capacitance per unit area. Additionally, as the larger top electrode (e.g., second capacitor electrode 106) can protect the dielectric layer (e.g., first dielectric layer 104) between the top and bottom electrodes (e.g., first and second capacitor electrodes 102 and 106), the high-k dielectric material in the dielectric layers can be protected against subsequent etching damage. With the protection of the larger top electrodes and reduced damage of the dielectric layers, the leakage current at room temperature between the top and bottom electrodes can be reduced by, for example, about two orders of magnitude (e.g., from about 8E-11 A to about 7E-13 A). In addition, the reliability of MIM capacitor structure 111 can be improved with reduced damage of the dielectric layer.

Referring to FIGS. 1A-1D, second passivation layer 140 can be disposed on MIM capacitor structure 111 to protect MIM capacitor structure 111 from water vapor and other contamination defects, according to some embodiments. In some embodiments, second passivation layer 140 can include the same dielectric material as first passivation layer 130. In some embodiments, second passivation layer 140 can include a layer of SiN, a layer of SiBN, or a combination thereof. In some embodiments, second passivation layer 140 can have a thickness 140t ranging from about 500 nm to about 1000 nm.

Redistribution vias 114, 116, and 118 can provide electrical connections between interconnects 103, 105, and 107 and redistribution structures 150A-150C, respectively. In some embodiments, as shown in FIGS. 1A-1C, redistribution via 116 can connect to interconnect 105 and first and third capacitor electrodes 102 and 122. Redistribution via 118 can connect to interconnect 107 and second and fourth capacitor electrodes 106 and 126. Redistribution via 114 can connect to interconnect 103 without connecting to capacitor electrodes 102, 106, 122, and 126. Redistribution vias 114, 116, and 118 can electrically connect MIM capacitor structure 111 and semiconductor device 101 to redistribution structures 150A-150C. Redistribution vias 114, 116, and 118 can be formed in ESL 120, first and second passivation layers 130 and 140. Redistribution vias 114, 116, and 118 can extend through capacitor electrodes 102, 106, 122, and 126 as shown in FIG. 1C to connect to capacitor electrodes. The process to form redistribution vias 114, 116, and 118 connected to capacitor electrodes 102, 106, 122, and 126 is described in detail below. In some embodiments, redistribution vias 114, 116, and 118 can include Cu, Al, Co, Ti, Ru, other suitable conductive materials, and combinations thereof.

Redistribution structures 150A-150C can be disposed on second passivation layer 140 and electrically connected to redistribution vias 114, 116, and 118, respectively. Redistribution structures 150A-150C can connect MIM capacitor structure 111 and semiconductor device 101 to external devices or peripheral circuits of semiconductor structure 100. In some embodiments, redistribution structures 150A-150C can include Cu, Al, Co, Ti, Ru, other suitable conductive materials, and combinations thereof.

Figure 3:
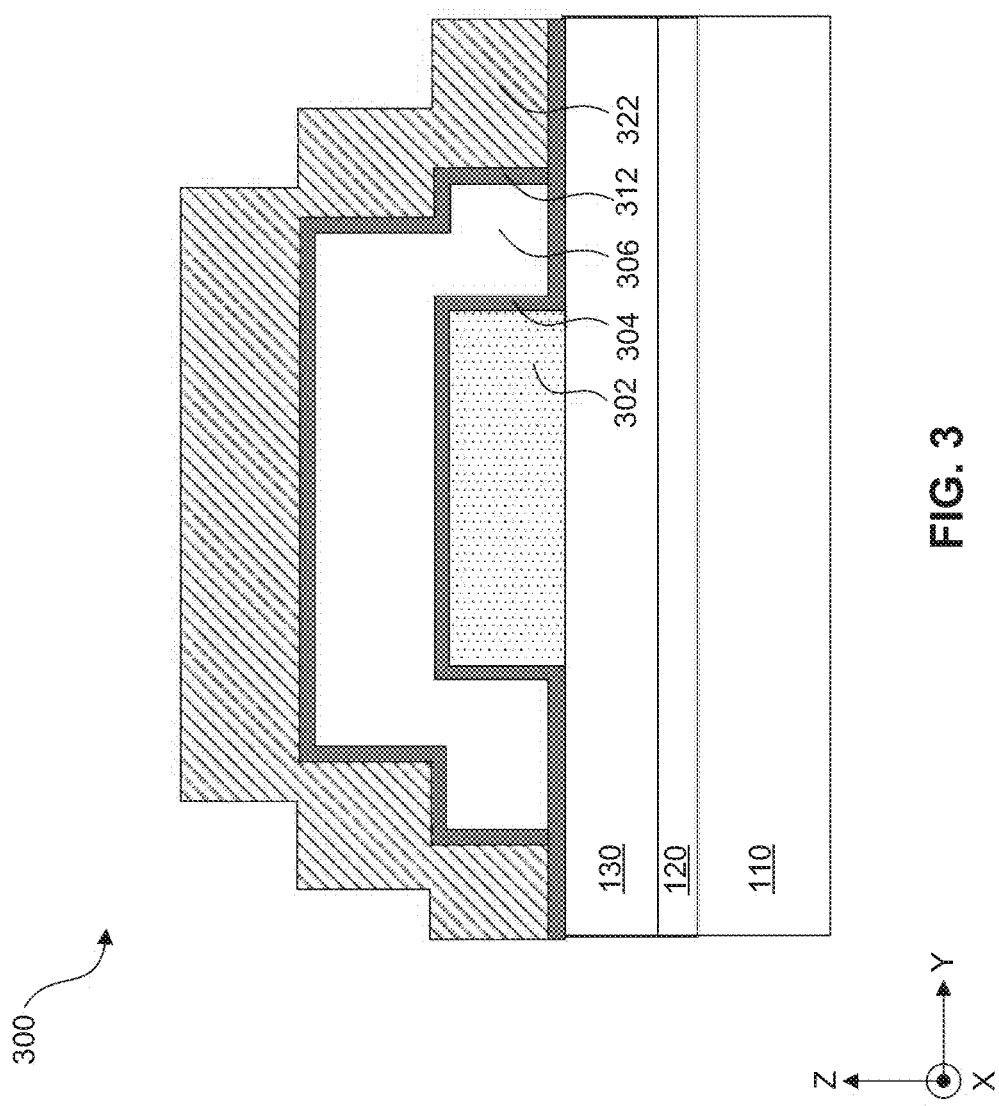
FIGS. 3-5 illustrate cross-sectional views of other MIM capacitor structures, in accordance with some embodiments.
Figure 4:
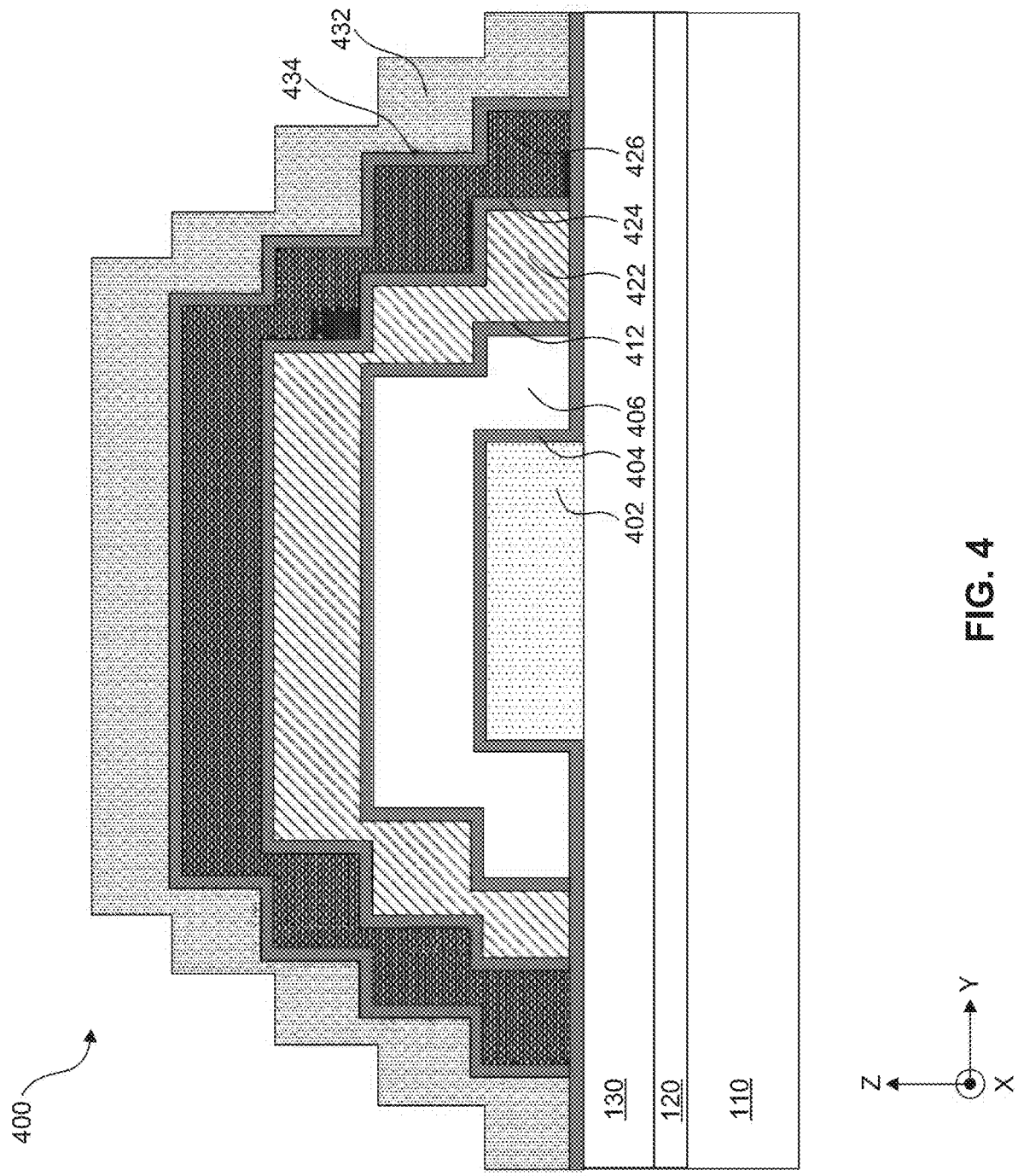
Figure 5:
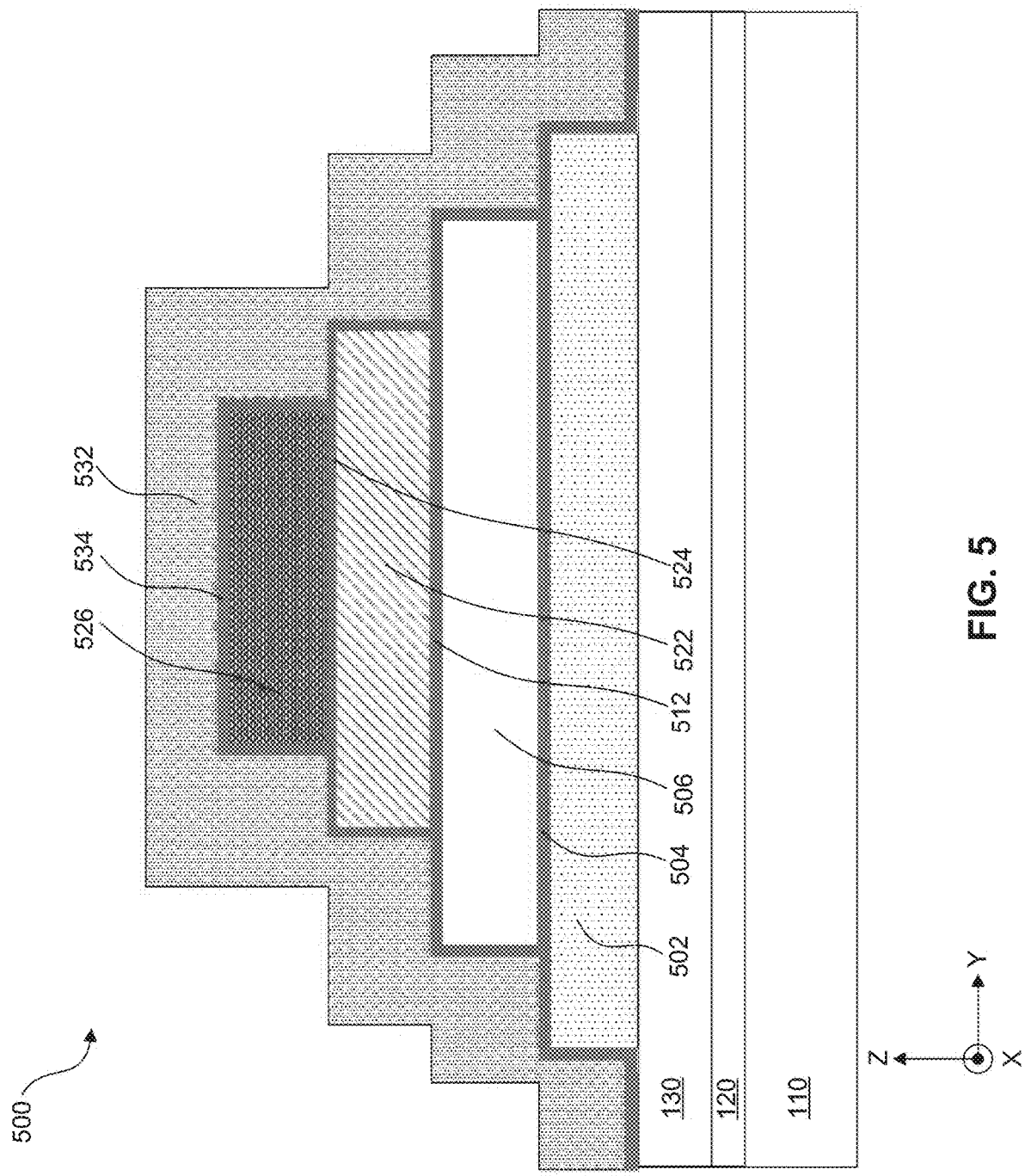

FIGS. 3-5 illustrate cross-sectional views of MIM capacitor structures 300, 400, and 500, respectively, in accordance with some embodiments. In some embodiments, the capacitor electrodes and dielectric layers in MIM capacitor structures 300, 400, and 500 can include the same materials and have the same dimensions as capacitor electrodes and dielectric layers in MIM capacitor structure 111. In some embodiments, the number of capacitor electrodes and dielectric layers in an MIM capacitor structure can be greater than or less than the number of capacitor electrodes and dielectric layers in MIM capacitor structures 111, 300, 400, and 500. As shown in FIG. 3, a MIM capacitor structure 300 can include a first capacitor electrode 302, a first dielectric layer 304, a second capacitor electrode 306, a second dielectric layer 312, and a third capacitor electrode 322. MIM capacitor structure 300 with fewer capacitor electrodes and dielectric layers can have a smaller capacitance than MIM capacitor structure 111. As shown in FIG. 4, a MIM capacitor structure 400 can include a first capacitor electrode 402, a first dielectric layer 404, a second capacitor electrode 406, a second dielectric layer 412, a third capacitor electrode 422, a third dielectric layer 424, a fourth capacitor electrode 426, a fourth dielectric layer 434, and a fifth capacitor electrode 432. MIM capacitor structure 400 with more capacitor electrodes and dielectric layers can have a larger capacitance than MIM capacitor structure 111.

In some embodiments, dielectric layers of MIM capacitor structures 111, 300, and 400 can have non-uniformity defects at corners of capacitor electrodes. For example, as shown in FIG. 1D, during the deposition of second capacitor electrode 106, overhang defects can be formed at edges of first capacitor electrode 102 and corners of second capacitor electrode 106. During subsequent deposition of second dielectric layer 112, the overhand defects may degrade the uniformity of second dielectric layer 112 and cause continuity issues of second dielectric layer 112 around the corners of second capacitor electrode 106. The decrease of uniformity and continuity of second dielectric layer 112 may increase the leakage between second capacitor electrode 106 and third capacitor electrode 122. In some embodiments, with the improvement of conformal deposition processes, such as atomic layer deposition (ALD) and chemical vapor deposition (CVD), the non-uniformity defects in MIM capacitor structure 111, 300, and 400 can be reduced by, for example, about four orders of magnitudes.

In some embodiments, as shown in FIG. 5, a MIM capacitor structure 500 can have both improved uniformity and reduced dielectric layer damage. Referring to FIG. 5, MIM capacitor structure 500 can include a first capacitor electrode 502, a first dielectric layer 504, a second capacitor electrode 506, a second dielectric layer 512, a third capacitor electrode 522, a third dielectric layer 524, a fourth capacitor electrode 526, a fourth dielectric layer 534, and a fifth capacitor electrode 532. Second capacitor electrode 506 can be smaller than first capacitor electrode 502, third capacitor electrode 522 can be smaller than second capacitor electrode 506, and fourth capacitor electrode 526 can be smaller than third capacitor electrode 522. These dimension differences can improve the uniformity of MIM capacitor structure 500. At the same time, fifth capacitor electrode 532 can be greater than first, second, third, and fourth capacitor electrodes 502, 506, 522 and 526, which can reduce etching damage to dielectric layers 504, 512, 524, and 534. As a result, MIM capacitor structure 500 can have one larger top capacitor electrodes (e.g., fifth capacitor electrode 532) and three smaller top capacitor electrodes (e.g., capacitor electrodes 526, 522, and 506) for improved uniformity and reduced dielectric layer damage. In some embodiments, the number of larger top capacitor electrodes in MIM capacitor structure 500 can be greater than one. For example, MIM capacitor structure 500 can have two larger top capacitor electrodes (e.g., capacitor electrodes 532 and 526) and two smaller top capacitor electrodes (e.g., capacitor electrodes 522 and 506).

Figure 6:
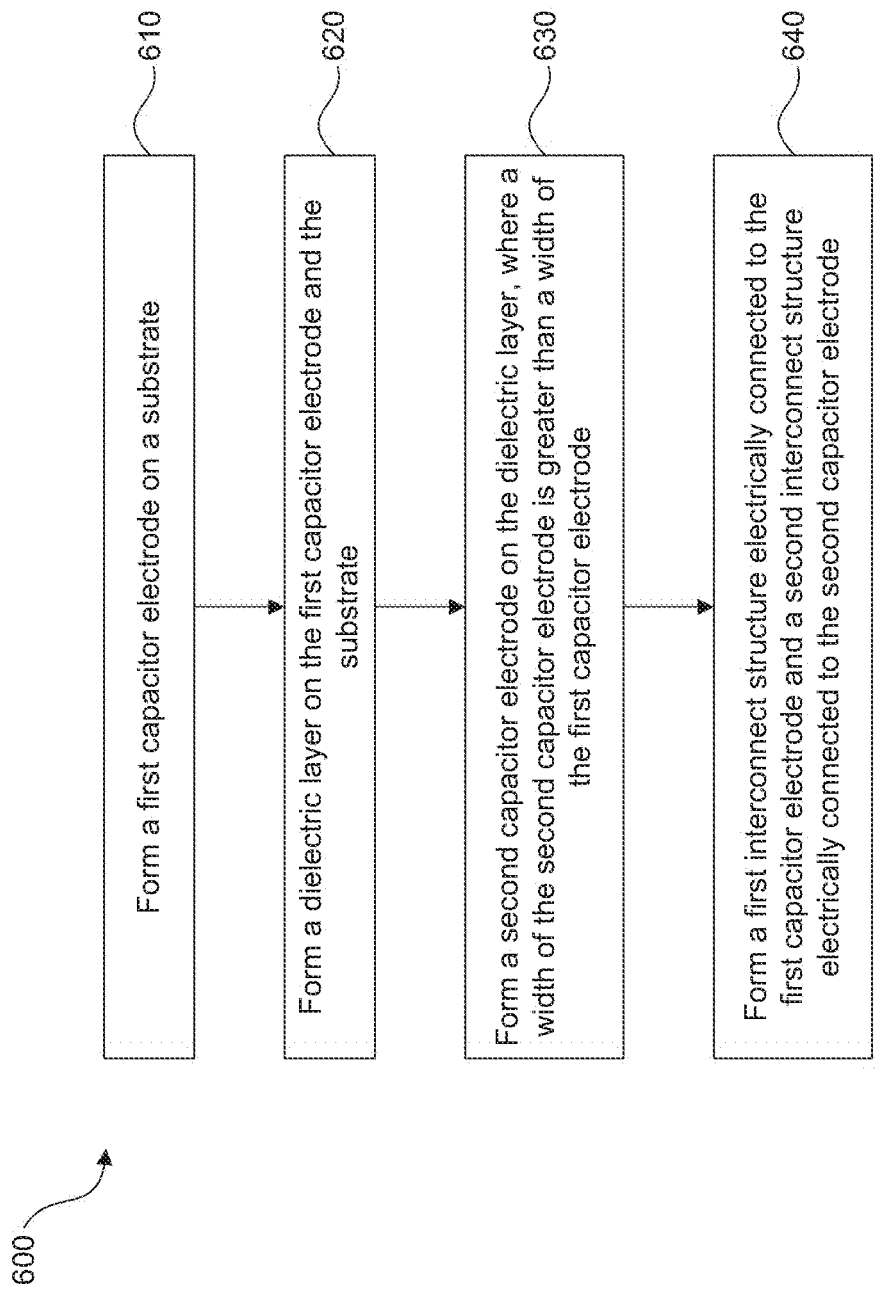
FIG. 6 illustrates a flow diagram of a method for forming an MIM capacitor structure, in accordance with some embodiments.

FIG. 6 is a flow diagram of a method 600 for fabricating an MIM capacitor structure, in accordance with some embodiments. Method 600 may not be limited to MIM capacitor structures 111, 300, 400, and 500 and can be applicable to other devices that would benefit from increased capacitance and reduced dielectric layer damage. Additional fabrication operations may be performed between various operations of method 600 and may be omitted merely for clarity and ease of description. Additional processes can be provided before, during, or after method 600; one or more of these additional processes are briefly described herein. Moreover, not all operations may be needed to perform the disclosure provided herein. Additionally, some of the operations may be performed simultaneously or in a different order than shown in FIG. 6. In some embodiments, one or more other operations may be performed in addition to or in place of the presently described operations.

For illustrative purposes, the operations illustrated in FIG. 6 will be described with reference to the example fabrication process for fabricating MIM capacitor structure 111 as illustrated in FIGS. 1A-1D and 7A-14B. FIGS. 7A, 9A, 11A, 13A, and 14A illustrate top-down views of MIM capacitor structure 111 at various stages of its fabrication, in accordance with some embodiments. FIGS. 7B, 9B, 11B, 13B, and 14B illustrate schematic views along line A-A of corresponding top-down views of MIM capacitor structure 111 at various stages of its fabrication, in accordance with some embodiments. FIGS. 7C, 8, 9C, 10, 11C, 12, and 13C illustrate cross-sectional views along line B-B of corresponding top-down views of MIM capacitor structure 111 at various stages of its fabrication, in accordance with some embodiments. Elements in FIGS. 7A-14B with the same annotations as elements in FIGS. 1A-1D and 2A-2B are described above.

Figure 7A:
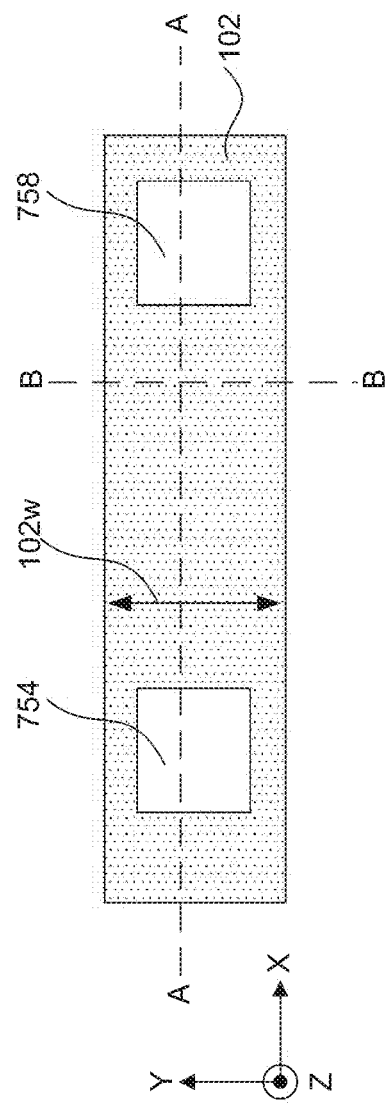
Figure 7B:
Figure 7C:
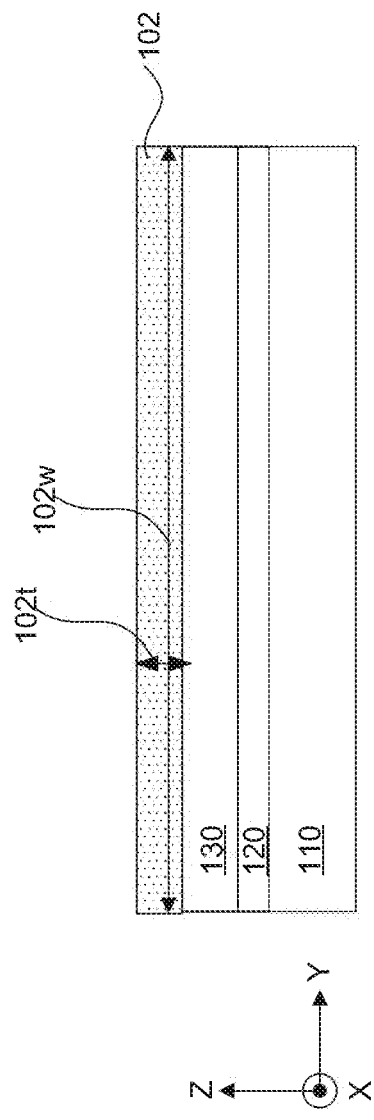

In referring to FIG. 6, method 600 begins with operation 610 and the process of forming a first capacitor electrode on a substrate. For example, as shown in FIGS. 7A-7C, first capacitor electrode 102 can be formed on a top surface of first passivation layer 130 and ESL 120 protected substrate 110. First capacitor electrode 102 can have width 102w. As described above, substrate 110 can include a silicon substrate. In some embodiments, prior to the formation of first capacitor electrode 102, first passivation layer 130 and ESL 120 can be deposited by CVD on substrate 110. In some embodiments, ESL 120 can have a thickness 120t ranging from about 50 nm to about 250 nm to protect interconnects 103, 105, and 107 on substrate 110 during etching of first passivation layer 130. In some embodiments, first passivation layer 130 can have a thickness 130t ranging from about 300 nm to about 900 nm to protect substrate 110 from water vapor and other contamination defects. In some embodiments, ESL 120 can include SiCN and first passivation layer 130 can include SiN.

In some embodiments, a first layer of conductive material can be conformally deposited on first passivation layer 130 by ALD, molecular beam epitaxy (MBE), high density plasma CVD (HDPCVD), metal organic (MOCVD), remote plasma CVD (RPCVD), plasma-enhanced CVD (PECVD), plating, other suitable methods, or combinations thereof. The deposition process can be performed in a deposition chamber, such as a PVD chamber, at a pressure below about 20 mTorr and at a temperature of about 100° C. The power level used in the deposition process can range from about 1000 W to about 6000 W. In some embodiments, the conductive material can include TiN, AlCu, Al, Cu, other suitable conductive materials, and combinations thereof. In some embodiments, the conductive material can include TiN.

In some embodiments, photolithography and etch operations can be processed on the first layer of conductive material to form first capacitor electrode 102. A masking layer can be formed over the first layer of conductive material to pattern the first layer of conductive material according to FIG. 7A. The masking layer can protect regions of first capacitor electrode 102 during the etching process. Composition of the masking layer can include a photoresist, a hard mask, and/or other suitable materials. The patterning process can include forming the masking layer over the first layer of conductive material, exposing the resist to a pattern, performing post-exposure bake processes, and developing the resist to form a masking element including the photoresist. The masking element can be used to protect regions of first capacitor electrode 102 while one or more etching processes sequentially removes exposed conductive material. First passivation layer 130 can act as an etch stop layer for etching the conductive material. The conductive material at windows 754 and 758 can be removed for subsequent formation of redistribution vias 114 and 118 without connecting to first capacitor electrode 102.

In some embodiments, the conductive material can be etched by a chlorine based wet etch, for example, a mix of hydrochloric acid (HCL) and ammonia. The conductive material can also be etched by a fluorine, chlorine or bromine based dry etch, such as a reactive ion etch (RIE) with fluorine, chlorine or bromine based ions (e.g., a mixture of boron chloride and chlorine or a mixture of carbon tetrafluoride and methane), and/or other suitable processes. Etching time can depend on thickness 102t of first capacitor electrode 102. And etching temperature can range from about 100° C. to about 300° C. After etching, first capacitor electrode 102 can be formed on first passivation layer 130 and can have a pattern as shown in FIG. 7A. In some embodiments, first capacitor electrode 102 can have width 102w ranging from about 1 um to about 50 um and thickness 102t ranging from about 20 nm to about 80 nm.

Figure 8:
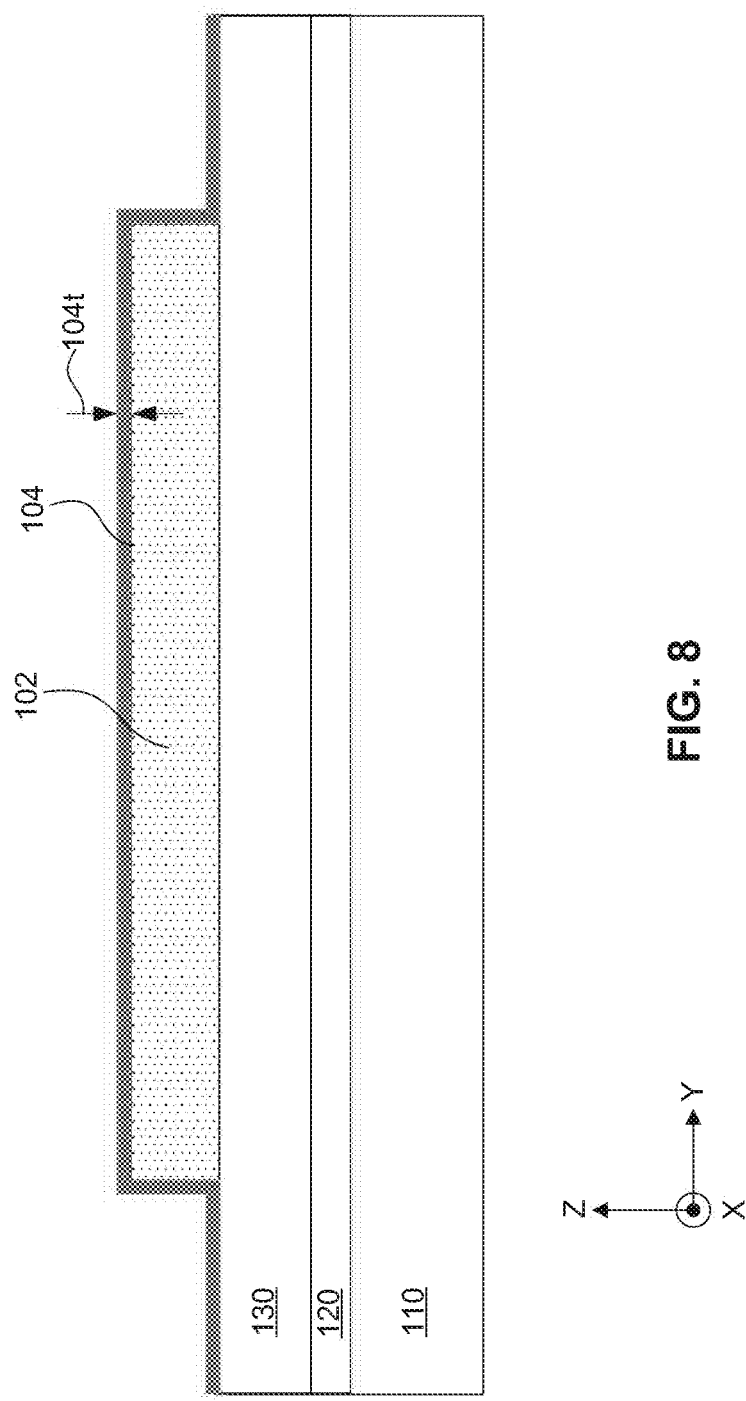

Referring to FIG. 6, in operation 620, a dielectric layer can be formed on the first capacitor electrode and the substrate. For example, as shown in FIG. 8, first dielectric layer 104 can be formed on top and side surfaces of first capacitor electrode 102 and on the top surface of first passivation layer 130 and ESL 120 protected substrate 110. In some embodiments, a high-dielectric constant (high-k) material can be conformally deposited on first capacitor electrode 102 and first passivation layer 130 to form first dielectric layer 104. The k-value of first dielectric layer 104 can be greater than about 3.9 (e.g., equal to about 7)

depending on the type of material. Thickness $104t$ of first dielectric layer 104 can range from about 1 nm to about 10 nm.

In some embodiments, first dielectric layer 104 can include silicon nitride ($SiN_x$) with a k-value of about 7, conformally deposited with a plasma-enhanced chemical vapor deposition (PECVD) process at a deposition temperature of about 180° C. In some embodiments, first dielectric layer 104 can include silicon oxide ($SiO_2$) or silicon oxynitride ($SiON_x$) conformally deposited by, for example, CVD, PECVD, atmospheric pressure CVD (APCVD), sub-atmospheric pressure CVD (SACVD), or MOCVD. In some embodiments, first dielectric layer 104 can be a dielectric stack—which may include a bottom layer of zirconium oxide ($ZrO_2$), a middle layer of aluminum oxide ($Al_2O_3$), a top layer of $ZrO_2$—that can be conformally deposited at a temperature of about 210° C. and have a k-value greater than about 13 (e.g., 13.6). In some embodiments, first dielectric layer 104 can be a stack that includes hafnium-based dielectrics (e.g., hafnium oxide ($HfO_x$) and hafnium silicate ($HfSiO_x$)), titanium oxide ($TiO_2$), or tantalum oxide ($TaO_x$). In some embodiments, first dielectric layer 104 can be a high-k dielectric stack that includes one cycle of $HfO_x$ and three cycles of $ZrO_2$ conformally deposited by ALD and stacked in an alternating configuration. The high-k dielectric stack can have a k-value greater than about 15. In some embodiments, first dielectric layer 104 can also be a liquid phase high-k polymer that can be cured and hardened at a temperature below about 250° C. Additionally, in some embodiments, first dielectric layer 104 can be strontium titanium oxide ($SrTiO_3$) with a k-value between 100 and 200, barium-titanium oxide ($BaTiO_3$) with a k-value of about 500, barium-strontium-titanium oxide ($BaSrTiO_3$) with a k-value of between about 500 and 1000, or lead-zirconium-titanium oxide ($PbZrTiO_3$) with a k-value of about 1000. With a higher k-value, first dielectric layer 104 can provide a higher capacitance per unit area for MIM capacitor structure 111. However, first dielectric layer 104 with a higher k-value may be more prone to damage during subsequent etching processes.

Referring to FIG. 6, in operation 630, a second capacitor electrode can be formed on the dielectric layer. For example, as shown in FIGS. 9A-9C, second capacitor electrode 106 can be formed on top and side surfaces of first dielectric layer 104. Width $106w$ of second capacitor electrode 106 can be greater than width $102w$ of first capacitor electrode 102, In some embodiments, second capacitor electrode 106 can be conformally deposited on first dielectric layer 104 by the same process as first capacitor electrode 102 and according to a pattern as shown in FIG. 9A. In some embodiments, the conductive material at windows 954 and 956 can be removed for subsequent formation of redistribution vias 114 and 116 without connecting to second capacitor electrode 106. In some embodiments, second capacitor electrode 106 can include a conductive material the same as or different from first capacitor electrode 102. In some embodiments, second capacitor electrode 106 can include TiN.

In some embodiments, second capacitor electrode 106 can have overhang defects around corners 962 and 964 as well as edges of first capacitor electrode 102 in FIG. 9C. These overhang defects may affect the uniformity of a subsequent dielectric layer (e.g., second dielectric layer 112 in FIG. 10). As a result, a better uniformity of second capacitor electrode 106 at corners 962 and 964 can improve the uniformity of subsequent dielectric layers and capacitor electrodes. In some embodiments, with the improvement of conformal deposition processes (e.g., ALD and CVD), the non-uniformity defects in MIM capacitor structure 111 can be reduced by, for example, about four orders of magnitudes.

In some embodiments, width $106w$ of second capacitor electrode 106 can range from about 25 um to about 250 um. In some embodiments, width $106w$ can be greater than width $102w$ to ensure full coverage of first capacitor electrode 102 by second capacitor electrode 106. A difference between width $106w$ and width $102w$ can range from about 0.2 um to about 225 um. In some embodiments, a ratio of width $106w$ to width $102w$ can range from about 1 to about 10. If the ratio is less than about 1, second capacitor electrode 106 may not cover first capacitor electrode 102 and first dielectric layer 104, and first dielectric layer 104 may be damaged during the etching process of forming second capacitor electrode 106. If the ratio is greater than about 25, the protection of first dielectric layer 104 may not improve and the manufacturing cost may increase—which are both undesirable.

With a higher k-value dielectric material for first dielectric layer 104 and larger second capacitor electrode 106 than first capacitor electrode 102, capacitor 142 between first and second capacitor electrodes 102 and 106 as shown in FIG. 1C can have a higher capacitance per unit area. Additionally, second capacitor electrode 106 can protect the high-k dielectric material in first dielectric layer 104 from etching damage during the formation of second capacitor electrode 106. With the protection of second capacitor electrode 106 and reduced damage of first dielectric layer 104, the leakage current between first and second capacitor electrodes 102 and 106 at room temperature can be reduced by, for example, about two orders of magnitude (e.g., from about 8E-11 A to about 7E-13 A). Furthermore, the reliability of MIM capacitor structure 111 can be improved with reduced damage of first dielectric layer 104.

Figure 10:
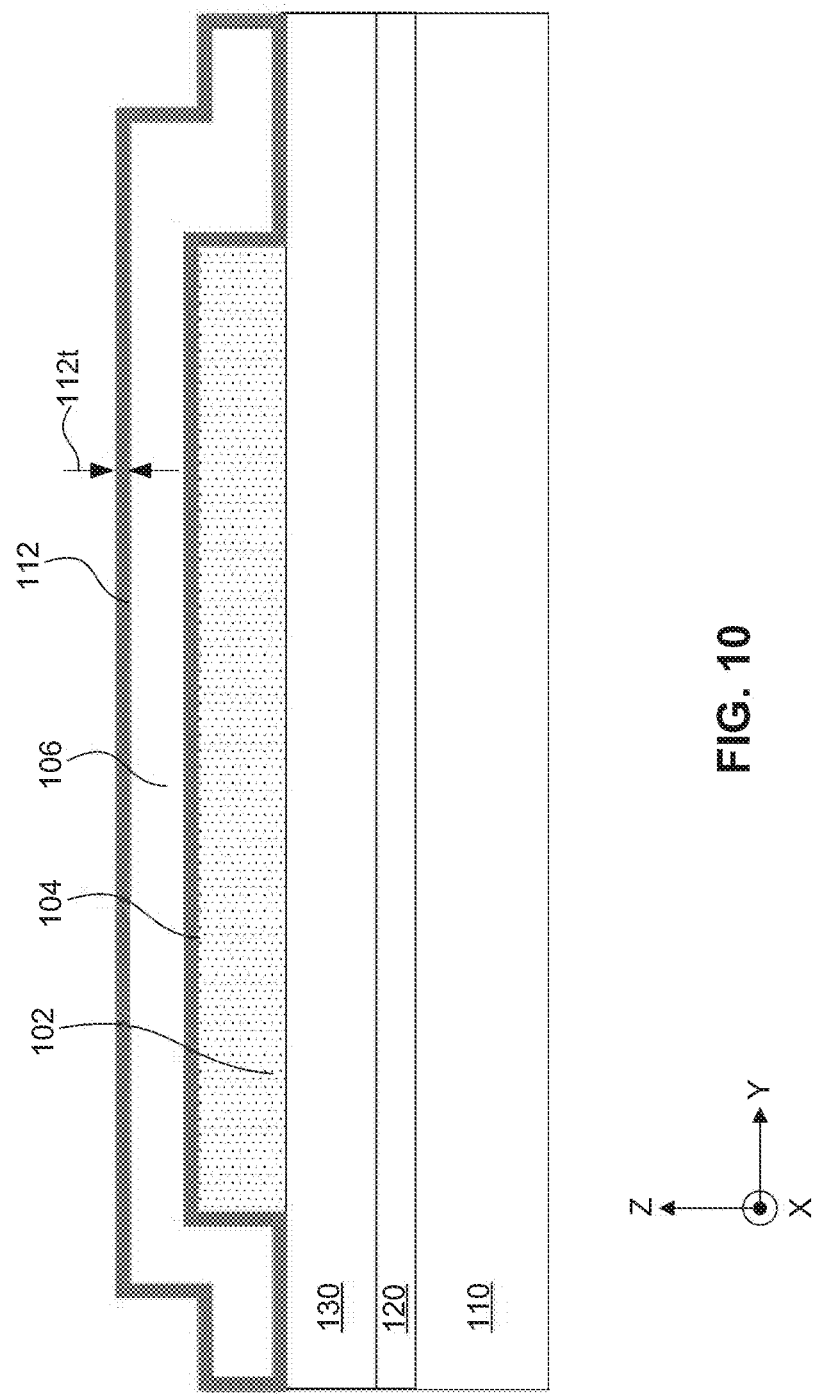

The formation of second capacitor electrode 106 can be followed by the formation of second dielectric layer 112, as shown in FIG. 10. Second dielectric layer 112 can be conformally deposited on second capacitor electrode 106 and first passivation layer 130 and ESL 120 protected substrate 110 in the same process as first dielectric layer 104. Second dielectric layer 112 can include a high-k dielectric material the same as or different from first dielectric layer 104.

The formation of second dielectric layer 112 can be followed by the formation of third capacitor electrode 122, as shown in FIGS. 11A-11C. In some embodiments, third capacitor electrode 122 can be conformally formed on second dielectric layer 122 by the same process as second capacitor electrode 106 and according to a pattern as shown in FIG. 11A. In some embodiments, the conductive material at windows 1154 and 1158 can be removed for subsequent formation of redistribution vias 114 and 118 without connecting to third capacitor electrode 122. In some embodiments, third capacitor electrode 122 can include a conductive material the same as or different from second capacitor electrode 106. In some embodiments, third capacitor electrode 122 can include TiN, In some embodiments, third capacitor electrode 122 can have a width $122w$ greater than width $106w$ of second capacitor electrode 106. In some embodiments, a difference between width $122w$ and width $106w$ can range from about 0.2 um to about 225 um.

Figure 12:
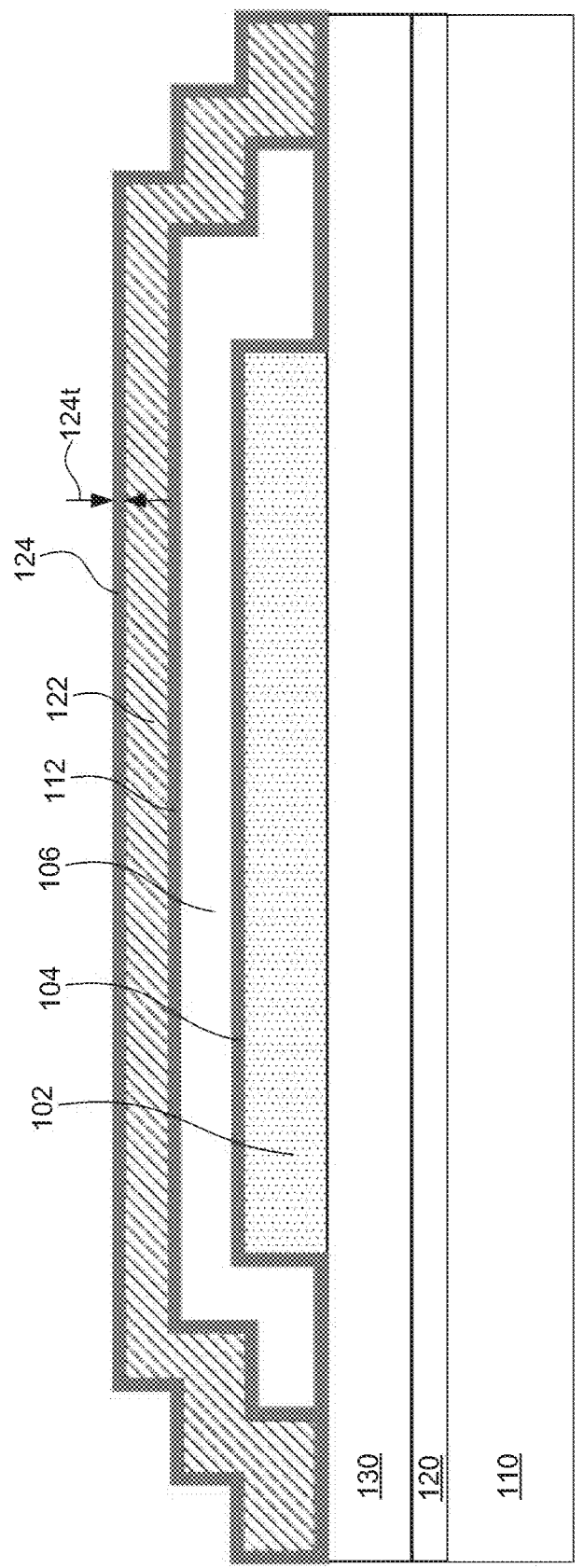

The formation of third capacitor electrode 122 can be followed by the formation of third dielectric layer 124, as shown in FIG. 12. Third dielectric layer 124 can be conformally deposited on third capacitor electrode 122 and first passivation layer 130 and ESL 120 protected substrate 110 in the same process as first dielectric layer 104. Third dielectric layer 124 can include a high-k dielectric material the same as or different from first dielectric layer 104.

Figure 13A:
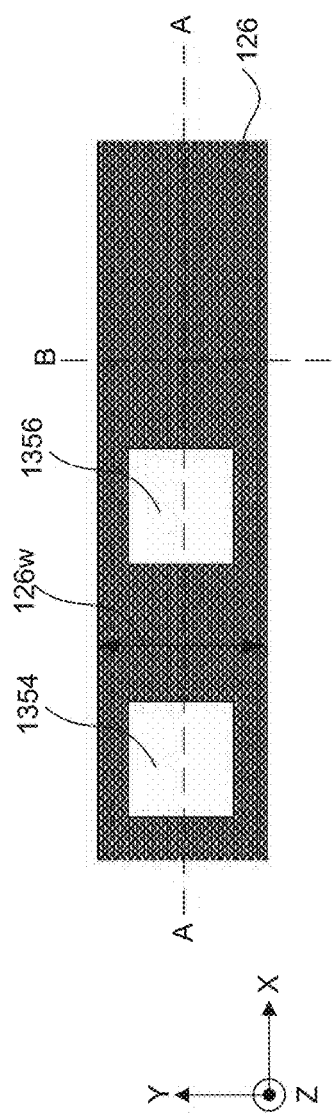
Figure 13B:
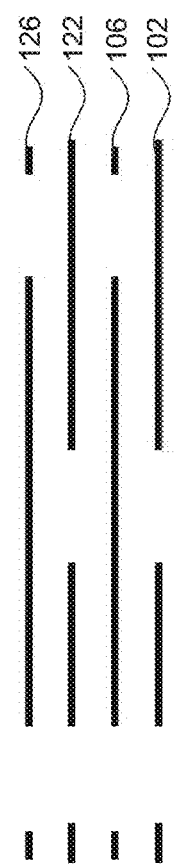
Figure 13C:
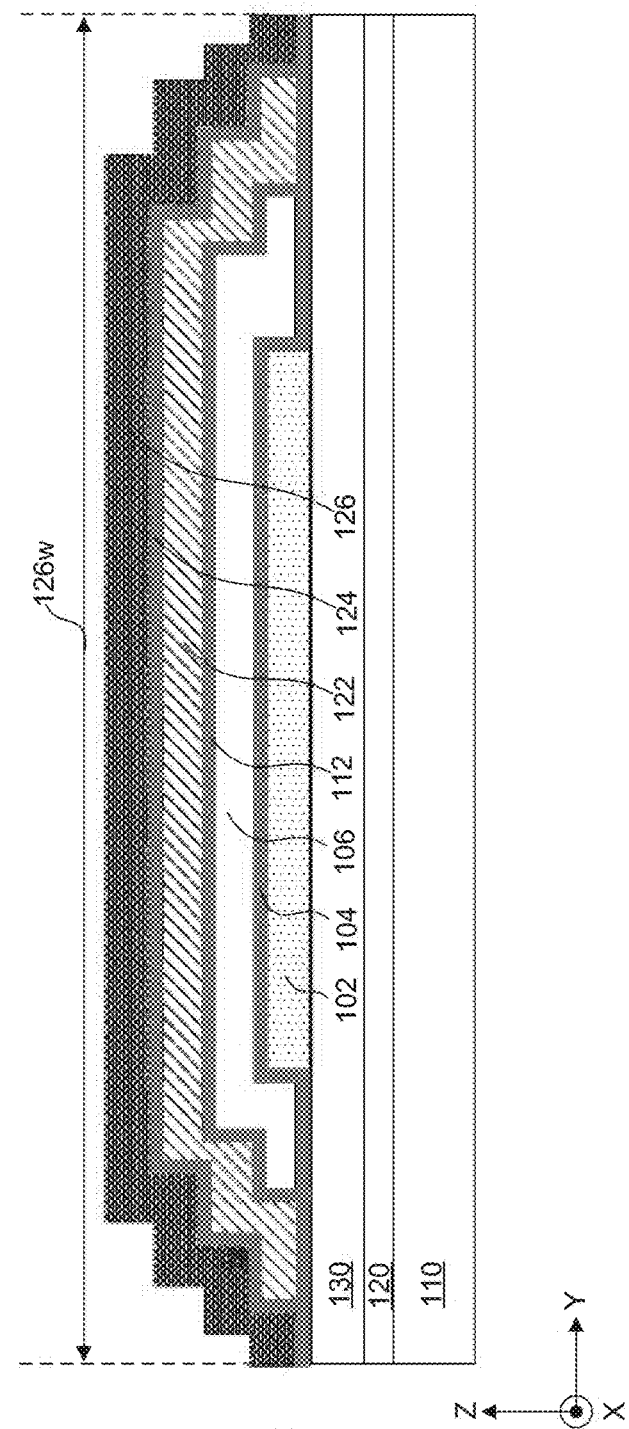

The formation of third dielectric layer 124 can be followed by the formation of fourth capacitor electrode 126, as shown in FIGS. 13A-13C. In some embodiments, fourth capacitor electrode 126 can be conformally formed on third dielectric layer 124 by the same process as third capacitor electrode 122 and according to a pattern as shown in FIG. 13A. In some embodiments, the conductive material at windows 1354 and 1356 can be removed for subsequent formation of redistribution vias 114 and 116 without connecting to fourth capacitor electrode 126. In some embodiments, fourth capacitor electrode 126 can include a conductive material the same as or different from third capacitor electrode 122. In some embodiments, fourth capacitor electrode 126 can include TiN. In some embodiments, fourth capacitor electrode 126 can have a width 126w greater than width 122w of third capacitor electrode 122. In some embodiments, a difference between width 126w and width 122w can range from about 0.2 um to about 225 um.

The formation of fourth capacitor electrode 126 can be followed by the formation of second passivation layer 140, as shown in FIG. 1A. In some embodiments, second passivation layer 140 can protect MIM capacitor structure 111 from water vapor and other contamination defects. In some embodiments, second passivation layer 140 can include the same dielectric material as first passivation layer 130. In some embodiments, second passivation layer 140 can include a layer of SiN. In some embodiments, second passivation layer 140 can have thickness 140t ranging from about 500 nm to about 1000 nm.

Referring to FIG. 6, in operation 640, a first interconnect structure can be formed to electrically connected to the first capacitor electrode and a second interconnect structure can be formed to electrically connected to the second capacitor electrode. For example, as shown in FIGS. 14A and 14B, redistribution vias 114, 116, and 118 can be formed on MIM capacitor structure 111. FIG. 14A illustrates top-down views of connections of redistribution vias 114, 116, and 118 to first, second, third, and fourth capacitor electrodes 102, 106, 122, and 126, according to some embodiments. FIG. 14B illustrates a schematic view of connections of redistribution vias 114, 116, and 118 to first, second, third, and fourth capacitor electrodes 102, 106, 122, and 126, according to some embodiments.

In some embodiments, redistribution vias 114, 116, and 118 can be formed by patterning and etching through first, second, third, and fourth capacitor electrodes 102, 106, 122, and 126. In some embodiments, redistribution via 116 can connect to first and third capacitor electrodes 102 and 122 of MIM capacitor structure 111. Redistribution via 118 can connect to second and fourth capacitor electrodes 106 and 126 of MIM capacitor structure 111. As shown in FIGS. 1C and 14B, first and second capacitor electrodes 102 and 106 can act as bottom and top electrodes of capacitor 142. Second and third capacitor electrodes 106 and 122 can act as bottom and top electrodes of capacitor 144. Third and fourth capacitor electrodes 122 and 126 can act as bottom and top electrodes of capacitor 146. Capacitors 142, 144, and 146 can be connected in parallel between redistribution vias 116 and 118, increasing the capacitance of MIM capacitor structure 111.

In some embodiments, the formation of redistribution vias 114, 116, and 118 can be followed by the formation of redistribution structures 150A-150C electrically connected to redistribution vias 114, 116, and 118, as shown in FIGS. 1A, 14A, and 14B. In some embodiments, redistribution structures 150A-150C can connect MIM capacitor structure 111 and semiconductor device 101 on substrate 110 to external devices or peripheral circuits of semiconductor structure 100.

Various embodiments in accordance with this disclosure provide methods of forming MIM capacitor structures 111, 300, 400, and 500 in semiconductor structure 100 to increase capacitance per unit area and reduce high-k dielectric material damage. First capacitor electrode 102 can be formed on substrate 110. First dielectric layer 104 having a higher dielectric constant can be conformally deposited on first capacitor electrode 102 to reduce the capacitance of MIM capacitor structure 111. Second capacitor electrode 106 can be formed on first dielectric layer 104 and substrate 110. Second capacitor electrode 106 can have width 106w greater than width 102w of first capacitor electrode 102 to cover first capacitor electrode 102 and protect first dielectric layer 104 from subsequent etching damage. In accordance with some embodiments of this disclosure, MIM capacitor structures 111, 300, 400, and 500 can provide higher capacitance per unit area, reduce damage to high-k dielectric material, reduce leakage current by, for example, about two orders of magnitude reduce and improve reliability of the 3D MIM capacitors.

In some embodiments, a metal insulator metal (MIM) structure includes a first capacitor electrode formed on a top surface of a substrate, a dielectric layer formed on the top and side surfaces of the first capacitor electrode and on the top surface of the substrate, and a second capacitor electrode formed on top and side surfaces of the dielectric layer. The first capacitor electrode has a first width. The second capacitor electrode has a second width greater than the first width.

In some embodiments, a system includes a redistribution layer and a capacitor structure. The capacitor structure includes a first capacitor electrode, a dielectric layer formed on top and side surfaces of the first capacitor electrode, and a second capacitor electrode formed on top and side surfaces of the dielectric layer. The system further includes a first interconnect structure electrically connecting the first capacitor electrode to the redistribution layer and a second interconnect structure electrically connecting the second capacitor electrode to the redistribution layer.

In some embodiments, a method includes forming a first capacitor electrode on a top surface of a substrate, forming a dielectric layer on top and side surfaces of the first capacitor electrode and the top surface of the substrate, and forming a second capacitor electrode on top and side surfaces of the dielectric layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A capacitor structure, comprising:
a first capacitor electrode on a top surface of a substrate, wherein the first capacitor electrode has a first width between first and second ends of the first capacitor electrode, and wherein the first end is opposite to the second end;
a first dielectric layer on the first capacitor electrode and the top surface of the substrate, wherein the first dielectric layer is in contact with a top surface, the first end, and the second end of the first capacitor electrode;
a second capacitor electrode on top and side surfaces of the first dielectric layer, wherein the second capacitor electrode has a second width greater than the first width;
a second dielectric layer on the second capacitor electrode and the first dielectric layer, wherein the second dielectric layer is conformal and in contact with sidewall surfaces of the second capacitor electrode;
a third capacitor electrode on side surfaces of the second dielectric layer; and
a third dielectric layer on the third capacitor electrode and the second dielectric layer, wherein third dielectric layer conformally covers sidewall surfaces of the third capacitor electrode.

2. The capacitor structure of claim 1, wherein a ratio of the second width to the first width ranges from about 1 to about 10.

3. The capacitor structure of claim 1, wherein a ratio of a thickness of the second capacitor electrode to a thickness of the first dielectric layer ranges from about 2 to about 50.

4. The capacitor structure of claim 1, further comprising one or more interconnect structures electrically connected to the first and second capacitor electrodes.

5. The capacitor structure of claim 1, further comprising a passivation layer on the second capacitor electrode.

6. The capacitor structure of claim 1, further comprising a passivation layer and an etch stop layer between the first capacitor electrode and the substrate.

7. The capacitor structure of claim 1, further comprising:
a third capacitor electrode on the second dielectric layer, wherein the third capacitor electrode has a third width greater than the second width.

8. The capacitor structure of claim 1, further comprising:
a fourth capacitor electrode on the third dielectric layer, wherein the fourth capacitor electrode has a fourth width greater than the third width;
a fifth dielectric layer on the fourth capacitor electrode and the third dielectric layer; and
a fifth capacitor electrode on the fifth dielectric layer, wherein the fifth capacitor electrode has a fifth width greater than the fourth width.

9. The capacitor structure of claim 1, further comprising:
a fourth capacitor electrode between the third dielectric layer and the second capacitor electrode, wherein the fourth capacitor electrode has a fourth width less than the third width;
a fourth dielectric layer between the fourth capacitor electrode and the second capacitor electrode; and
a fifth capacitor electrode between the third dielectric layer and the second capacitor electrode, wherein the fifth capacitor electrode has a fifth width less than the fourth width.

10. A system, comprising:
a redistribution layer; and
a capacitor structure comprising:
a first capacitor electrode, wherein the first capacitor electrode has first and second ends opposite to each other;
a first dielectric layer on top and side surfaces of the first capacitor electrode, wherein the first dielectric layer covers the first and second ends of the first capacitor electrode;
a second capacitor electrode on top and side surfaces of the first dielectric layer;
a second dielectric layer on the second capacitor electrode and the first dielectric layer, wherein the second dielectric layer conformally covers sidewall surfaces of the second capacitor electrode;
a third capacitor electrode on top and side surfaces of the second dielectric layer; and
a third dielectric layer on the third capacitor electrode and the first and second dielectric layers, wherein the third dielectric layer conformally covers sidewall surfaces of the third capacitor electrode;
a first interconnect structure electrically connecting the first capacitor electrode to the redistribution layer; and
a second interconnect structure electrically connecting the second capacitor electrode to the redistribution layer.

11. The system of claim 10, further comprising a passivation layer between the second capacitor electrode and the redistribution layer.

12. The system of claim 10, wherein a ratio of a width of the second capacitor electrode to a width of the first capacitor electrode ranges from about 1 to about 10.

13. The system of claim 10, wherein a width of the third capacitor electrode is greater than a width of the second capacitor electrode.

14. The system of claim 10, further comprising:
a fourth capacitor electrode on the third dielectric layer, wherein:
a width of the fourth capacitor electrode is greater than the width of the third capacitor electrode;
the first interconnect structure electrically connects the third capacitor electrode to the redistribution layer; and
the second interconnect structure electrically connects the fourth capacitor electrode to the redistribution layer.

15. The system of claim 10, wherein the first and second capacitor electrodes comprise titanium nitride.

16. A semiconductor structure, comprising:
a first capacitor electrode on a substrate and having a first width between first and second ends of the first capacitor electrode, wherein the first end is opposite to the second end;
a first dielectric layer covering top and side surfaces of the first capacitor electrode;
a second capacitor electrode covering top and side surfaces of the first dielectric layer, wherein the second capacitor electrode has a second width greater than the first width, and wherein the second capacitor electrode covers the first and second ends of the first capacitor electrode;
a second dielectric layer on the second capacitor electrode and the first dielectric layer, wherein the second dielectric layer conformally covers top and sidewall surfaces of the second capacitor electrode;
a third capacitor electrode on top and side surfaces of the second dielectric layer;

a third dielectric layer on the third capacitor electrode and the first and second dielectric layers, wherein the third dielectric layer conformally covers sidewall surfaces of the third capacitor electrode; and a fourth capacitor electrode on top and side surfaces of the third dielectric layer;

a first interconnect structure electrically connected to the first and third capacitor electrodes; and a second interconnect structure electrically connected to the second and fourth capacitor electrodes.

17. The semiconductor structure of claim 16, wherein a ratio of the second width to the first width ranges from about 1 to about 10.

18. The semiconductor structure of claim 16, wherein a ratio of a thickness of the second capacitor electrode to a thickness of the first dielectric layer ranges from about 2 to about 50.

19. The semiconductor structure of claim 16, further comprising a passivation layer on the second capacitor electrode.

20. The semiconductor structure of claim 16, further comprising a passivation layer and an etch stop layer between the first capacitor electrode and the substrate.

\* \* \* \* \*